US010156619B2

(12) United States Patent
Sakakibara

(10) Patent No.: US 10,156,619 B2
(45) Date of Patent: Dec. 18, 2018

(54) MAGNETIC RESONANCE IMAGING SYSTEM, STATIC MAGNETIC FIELD HOMOGENEITY ADJUSTING SYSTEM, MAGNETIC FIELD HOMOGENEITY ADJUSTING METHOD, AND MAGNETIC FIELD HOMOGENEITY ADJUSTING PROGRAM

(71) Applicant: HITACHI, LTD., Tokyo (JP)

(72) Inventor: Kenji Sakakibara, Tokyo (JP)

(73) Assignee: HITACHI, LTD., Tokyo (JP)

( * ) Notice: Subject to any disclaimer, the term of this patent is extended or adjusted under 35 U.S.C. 154(b) by 336 days.

(21) Appl. No.: 15/122,555

(22) PCT Filed: Feb. 26, 2015

(86) PCT No.: PCT/JP2015/055505
§ 371 (c)(1),
(2) Date: Aug. 30, 2016

(87) PCT Pub. No.: WO2015/133352
PCT Pub. Date: Sep. 11, 2015

(65) Prior Publication Data
US 2017/0089992 A1    Mar. 30, 2017

(30) Foreign Application Priority Data

Mar. 6, 2014  (JP) ................. 2014-044417

(51) Int. Cl.
*G01R 33/38*      (2006.01)
*G01R 33/3873*   (2006.01)
(Continued)

(52) U.S. Cl.
CPC ..... *G01R 33/3873* (2013.01); *G01R 33/3815* (2013.01); *G01R 33/243* (2013.01)

(58) Field of Classification Search
CPC ...... G01R 33/24; G01R 33/243; G01R 33/38; G01R 33/3815; G01R 33/3873; G01R 33/565; G01R 33/543; H01F 6/06
See application file for complete search history.

(56) References Cited

U.S. PATENT DOCUMENTS

2007/0035302 A1* 2/2007 Ikedo ............... G01R 33/56563
                                                                324/320
2007/0241755 A1* 10/2007 Ikedo ................... G01R 33/243
                                                                324/320
2012/0268119 A1* 10/2012 Abe .................... G01R 33/3873
                                                                324/307

FOREIGN PATENT DOCUMENTS

JP    2009-11652    1/2009
JP    2011-115480   6/2011

* cited by examiner

*Primary Examiner* — Son T Le
(74) *Attorney, Agent, or Firm* — Cooper & Dunham LLP

(57) ABSTRACT

Static magnetic field inhomogeneity is reduced by measuring inhomogeneity of a static magnetic field distribution in an imaging space, evaluating a distribution of a correction magnetic field that should be generated by a correction magnetic field generating unit disposed in the vicinity of the imaging space based on the measured static magnetic field distribution, reducing the electric current value of the superconducting coil to a predetermined (greater than zero) low current value smaller than a rated current value, notifying an operator to set a correction magnetic field of the correction magnetic field generating unit to the correction magnetic field evaluated by calculation in a state where an electric current at the low current value is flowing in the superconducting coil and a low static magnetic field B_low is being generated, and repeating the above operations.

15 Claims, 23 Drawing Sheets

(51) Int. Cl.
*G01R 33/3815* (2006.01)
*G01R 33/24* (2006.01)

FIG.4
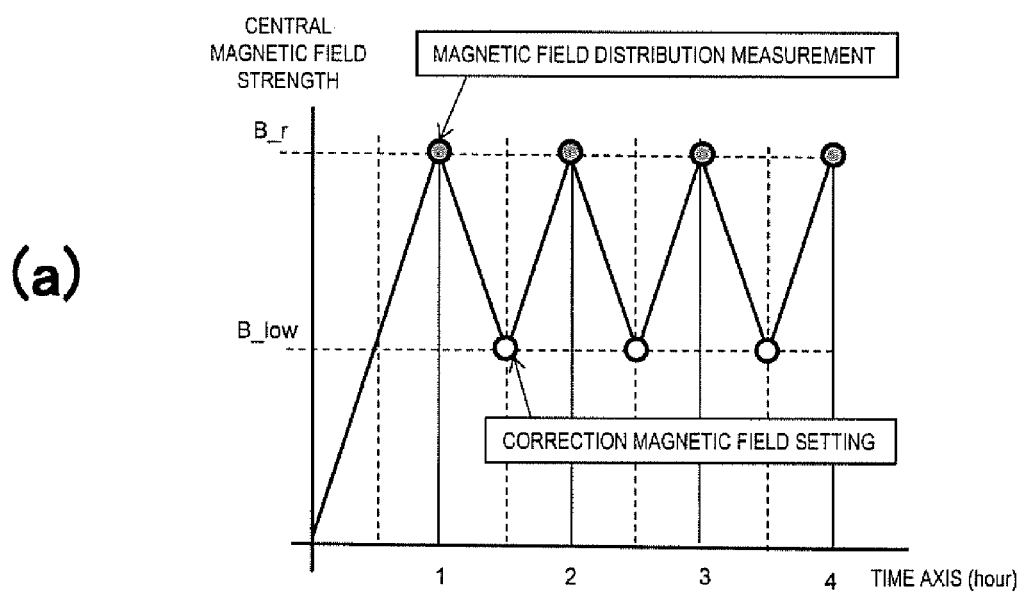
(a)
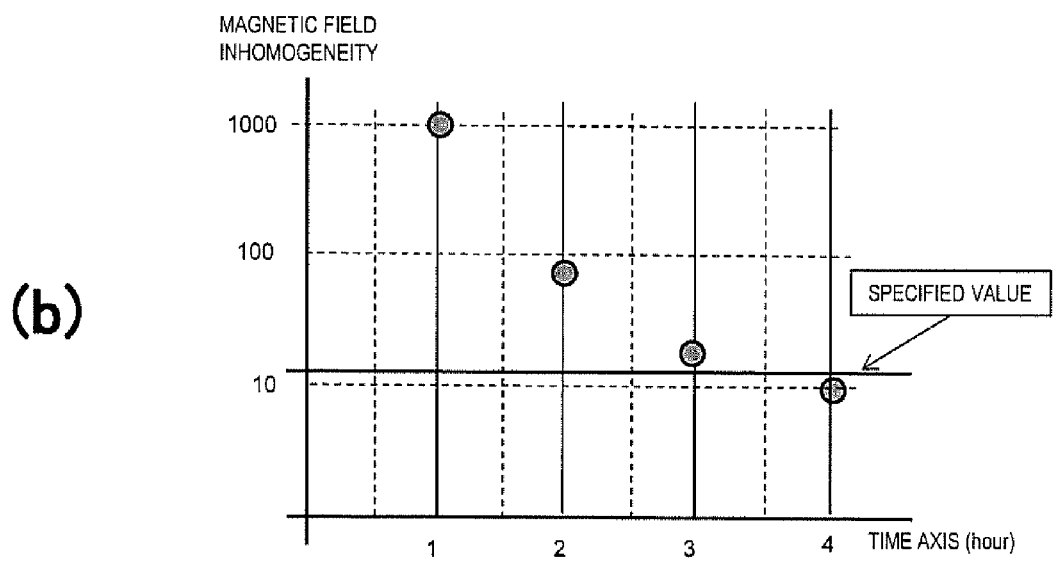
(b)

FIG.5
(a)
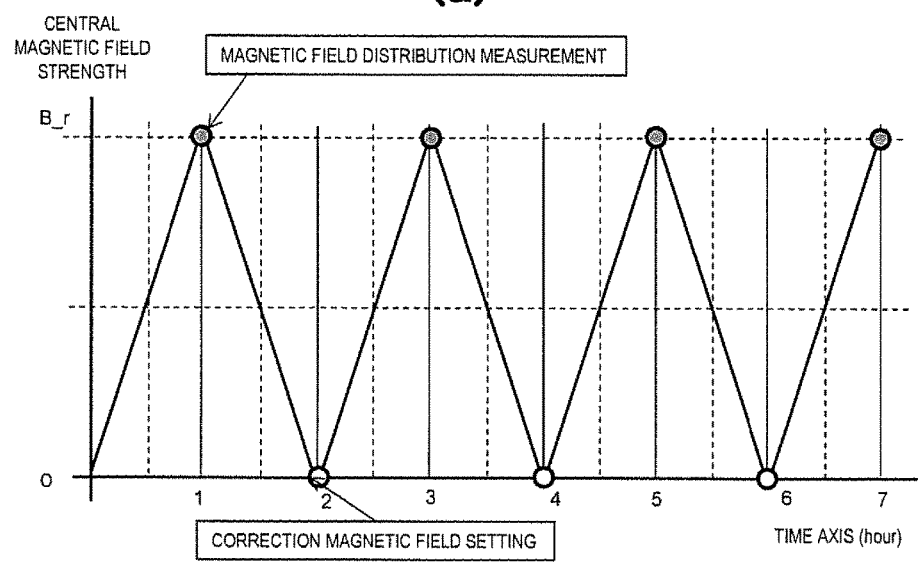
(b)
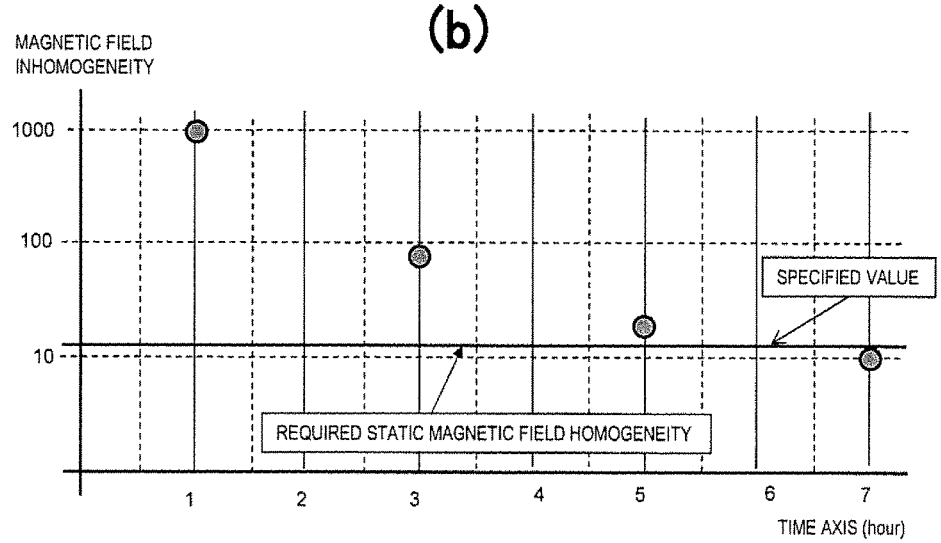

FIG.10
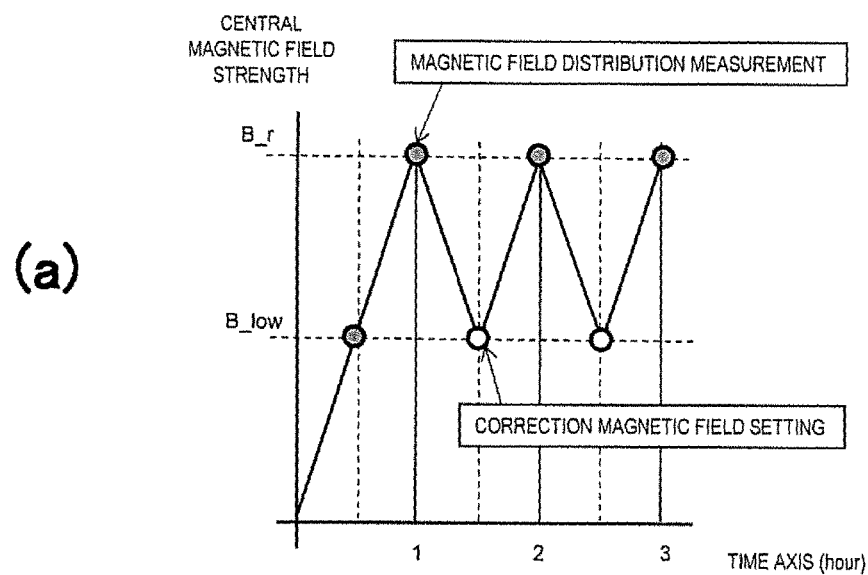
(a)
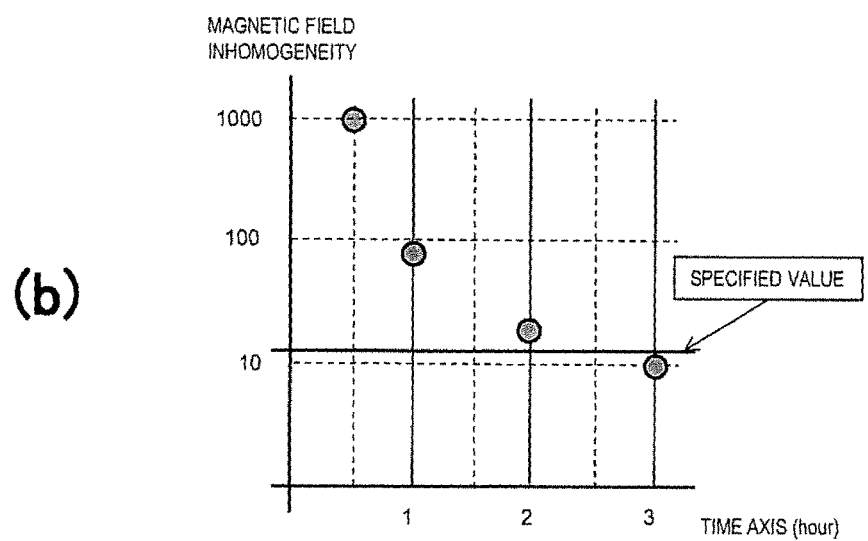
(b)

100 ppm@50 cm

MAGNETIC RESONANCE IMAGING SYSTEM, STATIC MAGNETIC FIELD HOMOGENEITY ADJUSTING SYSTEM, MAGNETIC FIELD HOMOGENEITY ADJUSTING METHOD, AND MAGNETIC FIELD HOMOGENEITY ADJUSTING PROGRAM

TECHNICAL FIELD

The present invention relates to a static magnetic field generating device for magnetic resonance imaging (hereinafter, referred to as MRI) and the static magnetic field adjustment method.

BACKGROUND ART

An MRI apparatus places an object in an imaging space in which a homogeneous static magnetic field is formed, measures nuclear magnetic resonance (hereinafter, referred to as NMR) signals of nuclear spins of the object, reconstructs nuclear spin density distribution, relaxation time distribution, and the like in the object, and then displays images as tomographic images.

As magnetic field generating sources of the MRI apparatus, used are a static magnetic field generating device that generates a static magnetic field in an imaging space and a gradient magnetic field generating device that generates a gradient magnetic field for providing positional information to NMR signals. When static magnetic field homogeneity formed in the imaging space by the static magnetic field generating device is disordered, linearity of a gradient magnetic field to be superimposed on the static magnetic field deteriorates, the positional information is shifted, distortions, defects, and the like are caused on images, and accuracy and clearness of the images are lost, which results in a great diagnostic difficulty.

An extremely high homogeneity is required for a static magnetic field in an imaging space. Also, because an NMR signal strength is approximately proportional to a static magnetic field strength, a static magnetic field generating device having a high static magnetic field strength is desired in order to obtain a high-quality MRI image. Thus, a high homogeneity and a high magnetic field are required for the static magnetic field in the imaging space of an MRI system.

Since a static magnetic field generating device has a highly homogeneous imaging space and is required to be stable for a long time and to be a high magnetic field, it has been common to use a superconducting magnet. Additionally, as the superconducting magnet, prevalently used is a cylinder-shaped magnet that is highly efficient to generate the high magnetic field. Inside the cylinder-shaped superconducting magnet, a plurality of superconducting coils are arranged in a low-temperature container where a liquid helium or the other low-temperature freezing medium was included. Additionally, outside the low-temperature container, a radiation shield and a vacuum chamber are disposed in order to prevent heat intrusion from the outside. Furthermore, a freezer to keep a low temperature is connected to the low-temperature container and/or the radiation shield.

In an MRI apparatus that uses a superconducting magnet as a static magnetic field generating device, a volume and a shape of an imaging space (hereinafter, referred to also as a field of view (FOV)) are specified by a peak-to-peak value of the magnetic field homogeneity and has an approximately spherical shape. In an MRI apparatus whose central magnetic field strength is 1.5 tesla, the field of view is a spherical shape whose diameter is approximately 45 to 50 cm, and the peak-to-peak value of the magnetic field homogeneity reaches tens of ppm (approx. 20 to 40 ppm).

Although a superconducting magnet is designed so as to generate a homogeneous magnetic field required for a desired space, the static magnetic field homogeneity can actually reach merely hundreds to thousands of ppm in an imaging space whose diameter is approximately 45 to 50 cm due to a measurement error when components (such as a coil winding frame) were manufactured and a positional error during the assembly (such as a relative position error of each coil).

In order to minimize the static magnetic field inhomogeneity caused by these measurement and positional errors, although the component manufacturing and assembly needs to be performed with an accuracy of hundreds of micrometers to a few millimeters, the superconducting magnet has a large-size cylindrical structure in which the inner diameter is approximately one meter (approx. 900 mm); the outer diameter is approximately two meters; and the axial length is approximately 1.5 meters, and it is very difficult to achieve an accuracy of hundreds of micrometers to a few millimeters for the measurement error. Therefore, the superconducting magnet is conventionally provided with a magnetic field adjustment method referred to as a passive shim that corrects static magnetic field inhomogeneity. The magnetic field adjustment method finely adjusts a static magnetic field using a shim iron piece (hereinafter, referred to as a magnetic shim) that is composed of minute magnetics.

A magnetic field leaking to the outside of a superconducting magnet generating a high magnetic field (hereinafter, referred to as a leakage magnetic field) has a wide range. For example, in a superconducting magnet whose central magnetic field has 1.5 to 3.0 tesla, the leakage magnetic field (for example, a 5-gauss line) reaches approximately 4 to 5 meters in the axial direction and approximately 2 to 3 meters in the radial direction from the magnetic field center and can reach out of the imaging room.

Due to the leakage magnetic field, magnetic fields are formed because ferromagnetic construction materials such as iron around an installation site of the superconducting magnet and magnetic shield materials such as electromagnetic soft iron disposed to restrict the leakage magnetic field are magnetized, which deteriorates static magnetic field homogeneity in an imaging space. It is desired that the magnetic field adjustment method also corrects such static magnetic field inhomogeneity (irregular magnetic field) due to a magnetic field from the outside of the superconducting magnet (environmental magnetic field).

As disclosed in FIG. 2 of Patent Literature 1 for example, a general shimming procedure first measures magnetic field spatial distribution of a superconducting magnet by a magnetic field measuring probe. Next, a series expansion for the measured magnetic field distribution is performed for a sum of polynomials such as Legendre polynomials in order to calculate static magnetic field inhomogeneity. Based on this result, shim positions are calculated. Shims are arranged in the calculated shim positions. Then, the magnetic field spatial distribution is measured again, and the above operation will be repeated until required homogeneity is achieved.

CITATION LIST

Patent Literature

PTL 1: Japanese Unexamined Patent Publication No. 2001-87245

SUMMARY OF INVENTION

Technical Problem

In correction magnetic fields to be generated by shims arranged using the shimming method described in PTL 1, errors are caused by magnetization of a magnetic shim member, human error where a part of thousand sheets of magnetic shims were mounted in wrong positions, and an error of the measured magnetic field distribution due to a position shift of a magnetic field measuring probe. Therefore, it is difficult to achieve a desired static magnetic field homogeneity unless a process of measuring spatial distribution of the above-described magnetic fields, a process of determining the shim position, and a process of mounting the magnetic shims in the shim positions are repeated a plurality of times, which results in that a few days are required to start up the MRI apparatus. Hereinafter, these error factors of the static magnetic fields will be further described.

The first error factor is an error caused by magnetization of a magnetic shim member to be used for static magnetic field adjustment. The error caused by magnetization of the magnetic shim member is due to a dimensional tolerance and a magnetization characteristic tolerance. Although a thin steel sheet with a thickness of approximately 0.05 to 0.5 mm such as an electromagnetic steel sheet is generally used as the magnetic shim member, there is a case where an error of approximately a few to tens of percentage compared to the ideal magnetization is caused due to a thickness tolerance and uneven magnetization. Generally, a static magnetic field inhomogeneity of a single superconducting magnet is hundreds to thousands of ppm due to errors of component manufacturing and assembly dimensions during manufacturing the superconducting magnet.

From the magnetic shim member that generates hundreds of to 1,000 ppm of correction magnetic fields to cancel the inhomogeneity, tens to 100 ppm of error components will be generated. Similarly, when the correction magnetic fields are approximately tens of ppm, the magnetic shims generate a few ppm of error components. The above errors of the magnetic shims can be ignored as the errors are asymptotic to a desired homogenous static magnetic field by repeating the static magnetic field adjustment process a plurality of times.

The second error factor is human error in the static magnetic field adjustment process. Generally, an operator arranges the magnetic shims based on arrangement positions and the amounts of the magnetic shims that were calculated by optimization calculation using a computer in the static magnetic field adjustment process. Generally, in order to generate correction magnetic fields that cancel static magnetic field inhomogeneity of the above single superconducting magnet, i.e. hundreds of ppm of correction magnetic fields, a few to tens of kilograms of magnetic shims are used.

For example, if a magnetic shim member weighs approximately a few grams per sheet, thousands of sheets of magnetic shims are to be used. In a case of arranging the thousands of sheets of magnetic shims, there is a possibility of mounting a few to tens of sheets in wrong positions. Similarly to the first error factor, the error caused by human error such as the wrong arrangement of the magnetic shims is eliminated by repeating the static magnetic field adjustment process to be asymptotic to a desired homogenous static magnetic field.

Also, the third error factor is an error in a mounting position of a static magnetic field measurement device. When 500 ppm of irregular magnetic field components linearly proportional to in the static magnetic field center position that is referred to as the Z term (or the X and Y terms) are generated on a radius of 25 cm for example, an error magnetic field of a few ppm is generated (500/250×a few millimeters) in a case where the static magnetic field measurement device is disposed with a few millimeters shifted in the Z-axis direction (or the X- and Y-axis directions). When correction magnetic fields are used as input data for distribution calculation in a state where such an error is generated, appropriate optimum solutions of the arrangement amount and the positions of the magnetic shims cannot be obtained, which increases the number of repetitions of the static magnetic field adjustment process.

In order to shorten the time required for repeating the static magnetic field adjustment process to eliminate an error, the time required for one static magnetic field adjustment process needs to be shortened.

Also, as another factor that makes the static magnetic field adjustment process difficult, there is a magnetic field (environmental magnetic field) that is generated by a ferromagnet located around a magnet. There is a ferromagnet such as a magnetic shield, ferromagnetic construction materials comprising a building, and the like around the superconducting magnet. These ferromagnetic construction materials are magnetized by a leakage magnetic field of the superconducting magnet to generate the environmental magnetic field. The environmental magnetic field disturbs magnetic field distribution in an imaging space. An irregular magnetic field due to the environmental magnetic field is superimposed with an error magnetic field of the superconducting magnet, and static magnetic field inhomogeneity is further increased, which increases the number of repetitions of the static magnetic field adjustment process.

In the static magnetic field adjustment process, while the process to measure magnetic field spatial distribution needs to be performed when the superconducting magnet is in a superconducting state, the process to arrange shims is performed after the superconducting magnet is demagnetized because the magnetic shims are adhered to the superconducting magnet in a strong magnetic field and the process cannot be performed. Since recent superconducting magnets of 1.5 to 3.0 T requires one or more hours to be excited to the rated static magnetic field strength $B_0$ and to be demagnetized, the above series of processes requires at least two or more hours, and a few more hours are required, considering time required for magnetic field measurement and shim arrangement.

Therefore, it takes a few days (two to three days) to achieve desired static magnetic field homogeneity by repeating the above processes a plurality of times, which results in extending a period required for delivery to a customer.

Also, when the superconducting magnet is demagnetized, an electric current is applied to a heater of a persistent current switch to heat the persistent current switch so that the persistent current switch connected to a superconducting coil inside the superconducting magnet is opened. As the heater generates heat, a refrigerant that cools the superconducting coil, i.e. liquid helium is evaporated and released to the outside of the magnet. Generally, because liquid helium equal to or more than tens of litters is consumed per unit time while an electric current is flowing in the heater, a large amount of expensive liquid helium is consumed each time the demagnetization is performed, which results in cost increase.

The purpose of the present invention is to provide an MRI apparatus that can reduce time and cost required for magnetic field adjustment.

Solution to Problem

According to the present invention, the following MRI apparatus is provided in order to achieve the above purpose. That is, the MRI apparatus has a static magnetic field generating device that includes a superconducting coil and generates a static magnetic field in an imaging space where an object is placed, a correction magnetic field generating unit that generates a correction magnetic field to reduce inhomogeneity of a static magnetic field distribution in the imaging space, a measurement unit that measures the static magnetic field distribution in the imaging space, an excitation power source that selectively supplies either of an electric current at a rated current value or an electric current at a predetermined (greater than zero) low current value smaller than the rated current value to the superconducting coil, and a calculation control unit that evaluates a distribution of the correction magnetic field that should be generated by the correction magnetic field generating unit using calculation based on the magnetic field distribution in the imaging space measured by the measurement unit.

An electric current at a rated current value is supplied from the excitation power source to the superconducting coil by the calculation control unit, and the distribution of the correction magnetic field that should be generated by the correction magnetic field generating unit is evaluated by first calculation based on the static magnetic field distribution measured by the measurement unit in a state where the electric current at the rated current value is flowing in the superconducting coil. Then, the electric current value of the superconducting coil is reduced to a low current value by the excitation power source, and an operator is notified to set a correction magnetic field of the correction magnetic field generating unit to the correction magnetic field distribution evaluated by the first calculation in a state where the electric current at a low current value is flowing in the superconducting coil. The above operations are repeated to reduce static magnetic field inhomogeneity.

Advantageous Effects of Invention

According to the present invention, time and cost required for magnetic field adjustment can be reduced.

BRIEF DESCRIPTION OF DRAWINGS

FIG. 4($a$) is a graph showing magnetic field variations in an imaging space of the first embodiment, and FIG. 4($b$) is a graph showing static magnetic field inhomogeneity variations of the first embodiment.

FIG. 5($a$) is a graph showing magnetic field variations in the imaging space of a comparative example, and FIG. 5($b$) is a graph showing static magnetic field inhomogeneity variations of the comparative example.

FIG. 10($a$) is a graph showing magnetic field variations in the imaging space of the second embodiment, and FIG. 10($b$) is a graph showing static magnetic field inhomogeneity variations of the second embodiment.

DESCRIPTION OF EMBODIMENTS

Hereinafter, the embodiments of the present invention will be described.

First Embodiment

Figure 1:
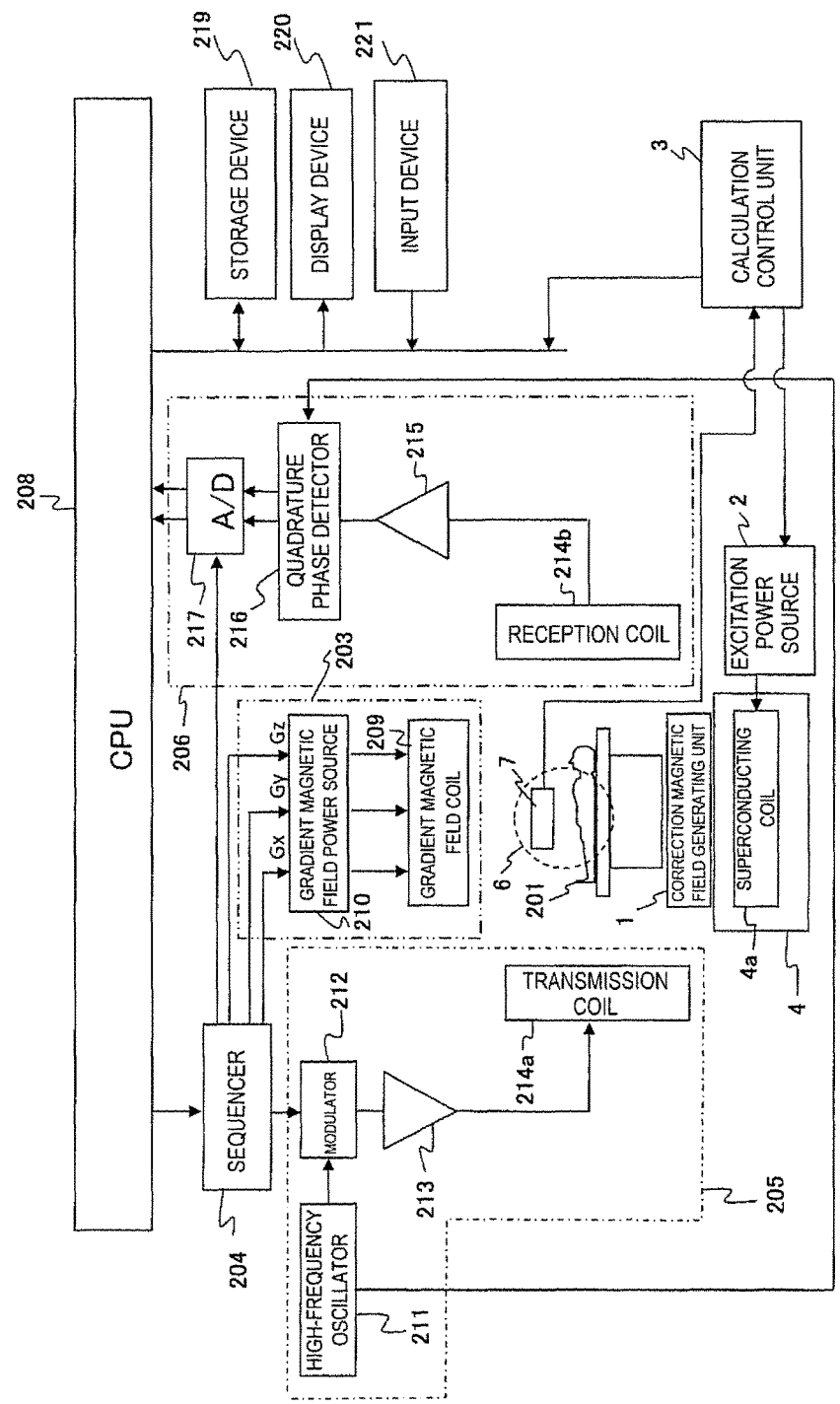
FIG. 1 is a block diagram showing an overall configuration of an MRI apparatus of a first embodiment.
Figure 2:
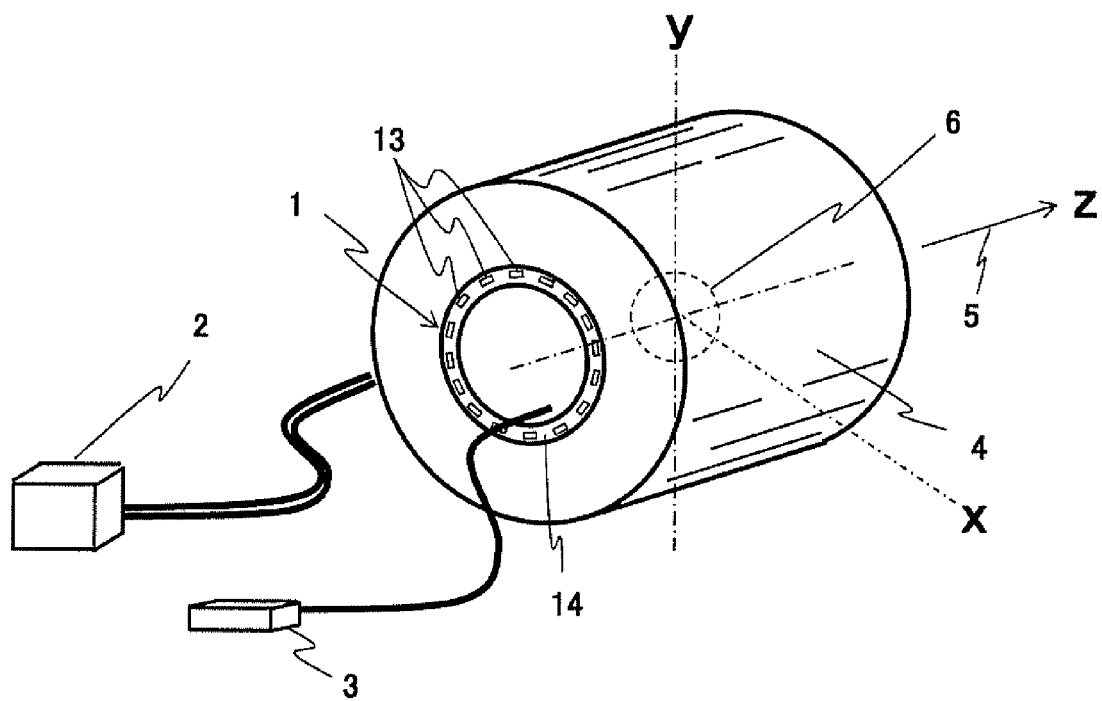
FIG. 2 is a perspective view of a static magnetic field generating device of the first embodiment.

An MRI apparatus of the present invention is provided with the static magnetic field generating device 4 as shown in FIGS. 1 and 2.

The static magnetic field generating device 4 includes the superconducting coil 4$a$ and generates a static magnetic field in an imaging space 6 where an object 201 is placed.

Also, the MRI apparatus is provided with a correction magnetic field generating unit 1 that generates a correction magnetic field to reduce static magnetic field distribution inhomogeneity in the imaging space 6, a measurement unit 7 that measures a static magnetic field distribution in the imaging space 6, an excitation power source 2, and a calculation control unit 3. The excitation power source 2 selectively supplies either of an electric current at a rated current value I_r or an electric current at a predetermined (greater than zero) low current value I_low (greater than zero) smaller than the rated current value I_r to the superconducting coil 4a. The calculation control unit 3 calculates a distribution of the correction magnetic field that should be generated by the correction magnetic field generating unit 1 based on the magnetic field distribution in the imaging space 6 measured by the measurement unit 7.

Figure 3:
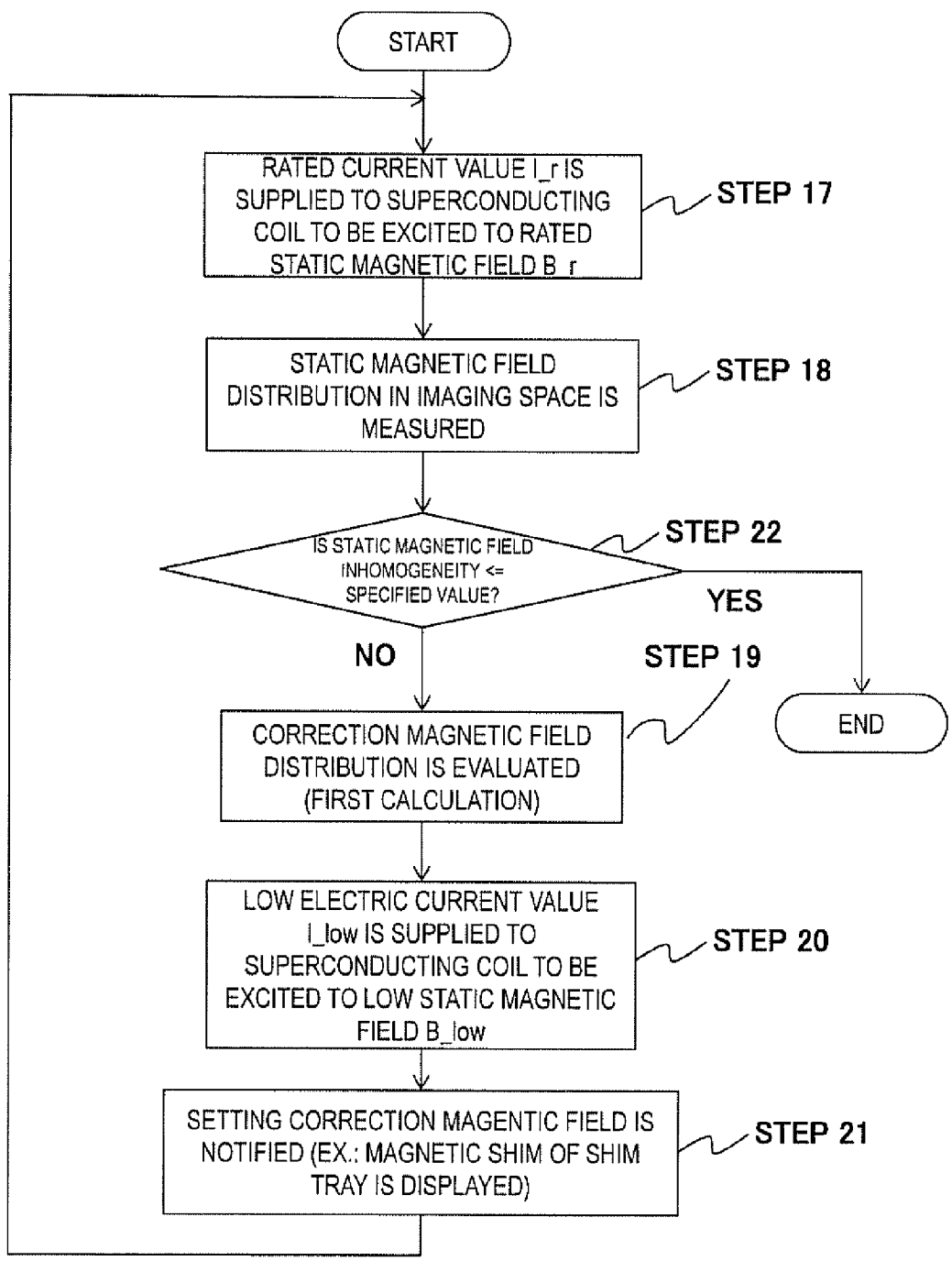
FIG. 3 is a flow chart showing operations of a calculation control unit of the first embodiment.

The electric current at the rated current value I_r is supplied from the excitation power source 2 to the superconducting coil 4a by the calculation control unit 3 as shown in the flow chart of FIG. 3 (Step 17) in order to generate a rated static magnetic field B_r in the imaging space 6. A distribution of the rated static magnetic field B_r measured by the measurement unit 7 is imported in a state where an electric current at the rated current value I_r is flowing in the superconducting coil 4a (Step 18). Based on the imported distribution of the rated static magnetic field B_r, a distribution of a correction magnetic field that should be generated by the correction magnetic field generating unit 1 is evaluated by the first calculation (Step 19). For example, a series expansion is performed for the measured distribution of the rated static magnetic field B_r using a spherical surface harmonic function or the like, and a correction magnetic field distribution is calculated based on the result. Then, an electric current value of the superconducting coil 4a is reduced to a low current value I_low by the excitation power source 2 (Step 20).

Hence, a static magnetic field strength is reduced to a low static magnetic field B_low that is lower than the rated static magnetic field B_r. An operator is notified to set a correction magnetic field of the correction magnetic field generating unit 1 to the correction magnetic field distribution evaluated by the first calculation in a state where an electric current at a low current value I_low is flowing in the superconducting coil 4a (Step 21). After the notification, the operator sets the correction magnetic field distribution of the correction magnetic field generating unit 1 in the state where an electric current at a low current value I_low is flowing in the superconducting coil 4a. Specifically, for example, the operator fixes magnetic shims in order to set the correction magnetic field. Additionally, the correction magnetic field setting can be performed not only by fixing the magnetic shims but also by applying an electric current to the shim coils.

The calculation control unit 3 repeats the operations of the above Steps 17 to 21 and notifies an operator of a correction magnetic field distribution that should be set each time the operations are repeated, and the operator adjusts the correction magnetic field distribution of the correction magnetic field generating unit 1. Hence, static magnetic field inhomogeneity is reduced to equal to or less than a specified value (Step 22).

FIG. 4(a) shows an example of the central magnetic field of the imaging space 6 while the above Steps 17 to 21 are being repeated. As shown in FIG. 4(a), the central magnetic field of the imaging space 6 repeatedly changes between a rated static magnetic field B_r and a low static magnetic field B_low. A static magnetic field is measured in the rated static magnetic field B_r, and an operator adjusts a correction magnetic field in the low static magnetic field B_low. Hence, as shown in FIG. 4(b), static magnetic field inhomogeneity is reduced and reaches equal to or less than a specified value each time the changes of the rated static magnetic field B_r and the low static magnetic field B_low are repeated.

As a comparative example, shown in FIGS. 5(a) and 5(b) respectively are changes of a static magnetic field and static magnetic field inhomogeneity in a case where a static magnetic field distribution is measured after exciting it to a rated static magnetic field B_r and is completely demagnetized to set a correction magnetic field.

A sweep speed (excitation or demagnetization speed) of the static magnetic field in FIG. 5(a) is the same as FIG. 4(a). Comparing FIG. 5(a) that is the comparative example with FIG. 4(a) of the present invention, because the static magnetic field is not completely demagnetized but is reduced to a low static magnetic field B_low in the present invention when a correction magnetic field is set, it is found that the same number of times of correction magnetic field setting can be repeated in a shorter time than the comparative example. Therefore, as shown in FIGS. 4(b) and 5(b), the present invention can achieve static magnetic field inhomogeneity equal to or less than a specified value in a shorter time than the comparative example. Also, in a case where a predetermined time is provided for static magnetic field adjustment, the correction magnetic field setting of the present invention can be repeated more often than the conventional invention, which can further reduce the static magnetic field inhomogeneity.

Additionally, a low current value I_low is a predetermined value at which an operator can adjust a correction magnetic field of the correction magnetic field generating unit 1 in a state where a low static magnetic field B_low is being generated by the low current value I_low. For example, in a case where the correction magnetic field generating unit 1 is configured to include magnetic shims and one or more shim trays 13 supporting the magnetic shims, a low static magnetic field B_low is set by evaluating a value of an electromagnetic force to be applied to the magnetic shims in calculations or experiments so that the operator can attach and detach at least one of the shim trays 13, to which magnetic shims were attached, in a predetermined position of the imaging space 6 in a state where the low static magnetic field B_low is being generated.

A detailed description will be made for the above. The shim trays 13 are formed with non-magnetic materials and are detachably arranged in a position closer to the imaging space 6 than the static magnetic field generating device 4 as shown in FIG. 2.

Whatever the shape, the shim trays 13 have a configuration where a plurality of the plate-shaped shim trays 13 with a predetermined width are arranged at certain intervals so that they are along the inner wall of the cylindrical static magnetic field generating device 4 and the longitudinal axis direction is parallel to the axial direction of the cylinder in an example of FIG. 2. The correction magnetic field generating unit 1 includes a shim tray holder 14 supporting the shim trays 13 so as to be arranged as above. The shim tray holder 14 has a configuration where each of the shim trays 13 can be drawn out and removed in parallel to the longitudinal axis direction from both the end surfaces of the static magnetic field generating device 4.

An operator can arrange the magnetic shims with a predetermined size in predetermined positions in the vicinity of the imaging space 6 by drawing out each of the shim trays 13 from the shim tray holder 14, fixing the magnetic shims with a predetermined size in predetermined positions, and then inserting the shims into the shim tray holder 14 again. Hence, a correction magnetic field can be set. The calculation control unit 3 evaluates arrangement of the magnetic shims on the shim trays 13 as a correction magnetic field distribution.

It is desired that the above-described low current value I_low is set so that an electromagnetic attraction force to be applied to one of the shim trays 13 attached to the magnetic shims is equal to or less than a predetermined W (more than 0, for example, 5) kg in a state where the low static magnetic field B_low is being generated. In a case where the electromagnetic attraction force is equal to or less than W kg, an operator can attach and detach the shim trays 13 in the low static magnetic field B_low.

Additionally, it is desirable that the shim trays 13 and the shim tray holder 14 are configured not to be deformed by stresses respectively working on both of the shim trays 13 and the shim tray holder 14 even when they are attached and detached in a state where an electromagnetic attraction force is equal to or less than W kg is applied.

Figure 6:
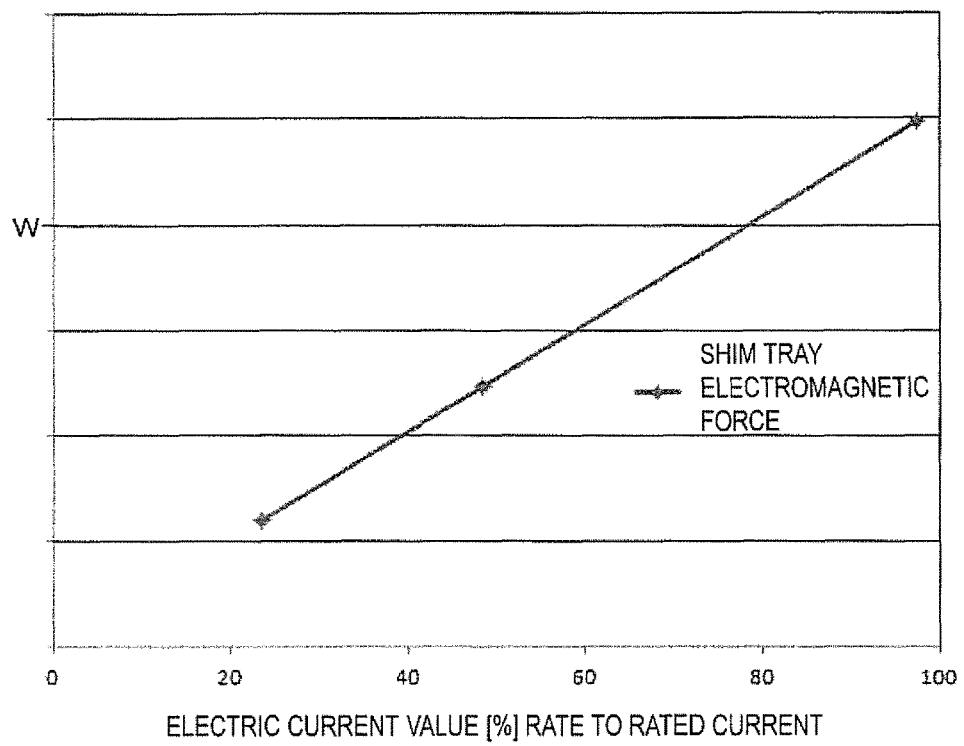
FIG. 6 is a graph showing a relationship between an electric current of a superconducting coil of the first embodiment and an electromagnetic attraction force to be applied to a shim tray.

As shown in FIG. 6, because a value of an electric current to be supplied to the superconducting coil 4*a* is proportional to an electromagnetic attraction force to be generated on the shim trays 13, a low current value I_low is set so that the electromagnetic attraction force is equal to or less than W kg.

For example, in a case of the static magnetic field generating device 4 that generates a rated static magnetic field B_r of 1.5 Tesla, the electromagnetic attraction force working on the shim trays is approximately 10 kg. Therefore, in a case where a low static magnetic field B_low is set to approximately a half of 1.5 Tesla, the electromagnetic attraction force is 5 kg, and an operator can attach and detach the shim trays, to which the magnetic shims are attached, alone. Hence, by setting a low current value I_low to equal to or less than a half of a rated current value I_r, the electromagnetic attraction force can be set to equal to or less than 10 kg.

Therefore, as shown in the above FIGS. 4(*a*) and 4(*b*), a correction magnetic field can be adjusted without complete demagnetization by inserting the shim trays 13, to which the magnetic shims are fixed, into the shim tray holder 14 in a low static magnetic field B_low, which can adjust a static magnetic field in a shorter time than a case of completely demagnetizing as shown in FIGS. 5(*a*) and 5(*b*).

(Overall Configuration of MRI Apparatus)

Here, the overall configuration of the MRI apparatus of the present embodiment will be described based on FIG. 1. As shown in FIG. 1, the MRI apparatus comprises the static magnetic field generating device 4, the excitation power source 2, the measurement unit 7, the calculation control unit 3, a gradient magnetic field generating system 203, a transmission system 205, a reception system 206, a sequencer 204, a central processing unit (CPU) 208, a storage device 219, an input device 221, and a display device 220.

The static magnetic field generating device 4 includes the superconducting coil 4*a*. Although an orientation of a static magnetic field to be generated may be a vertical direction or a horizontal direction, a cylinder-shaped static magnetic field generating device 4, in which an axial direction 5 of the static magnetic field is oriented in the horizontal direction, is used here as an example as shown in FIG. 2. The imaging space 6 to which a homogeneous static magnetic field was applied is formed in an internal cylindrical space as shown in FIG. 2.

The gradient magnetic field generating system 203 includes a gradient magnetic field coil 209 that applies a gradient magnetic field in the directions of the three axes X, Y, and Z that are a coordinate system (static coordinate system) of the MM apparatus and a gradient magnetic field power source 210 that drives the gradient magnetic field coil 209. The gradient magnetic field power source 210 supplies an electric current to the gradient magnetic field coil 209 following a command signal from the sequencer 204 and applies gradient magnetic fields Gx, Gy, and Gz in the X, Y, and Z axes to the imaging space 6.

The transmission system 205 comprises a high-frequency oscillator 211, a modulator 212, a high-frequency amplifier 213, and a high-frequency coil on the transmission side (transmission coil) 214*a*. Using this configuration, the transmission system 205 irradiates RF (high-frequency magnetic field) pulses to the object 201 in order to generate an NMR phenomenon to atomic nucleus spin of atoms comprising a biological tissue of the object 201. Specifically, the high-frequency oscillator 211 outputs the RF pulses, and the modulator 212 amplitude-modulates the RF pulses at a timing of a command from the sequencer 204. The amplitude-modulated RF pulses are amplified by the high-frequency amplifier 213 and is supplied to the high-frequency coil 214*a* disposed in the vicinity of the object 201, and then the RF pulses are irradiated to the object 201 from the high-frequency coil 214*a*.

The reception system 206 comprises a high-frequency coil on the reception side (reception coil) 214*b*, a signal amplifier 215, a quadrature phase detector 216, and an A/D converter 217. Using this configuration, the reception system 206 detects echo signals (NMR signals) to be emitted by nuclear magnetic resonance of atomic nucleus spin of atoms comprising a biological tissue of the object 201. A response signal of the object 201 induced by an electromagnetic wave irradiated from the high-frequency coil on the transmission side 214*a* is detected in the high-frequency coil 214*b* disposed in the vicinity of the object 201, is amplified by the signal amplifier 215, and then is divided into two-system signals orthogonal to each other by the quadrature phase detector 216 at a timing of a command from the sequencer 204.

The respective signals are converted into a digital amount by the A/D converter 217 and are transmitted to the CPU 208.

The input device 221 is used by a user to input various control information of the MRI apparatus and control information of signal processing to be performed by the CPU 208 and includes a trackball, a mouse, a keyboard, and the like. The input device 221 is disposed in the vicinity of the display device 220, and an operator interactively controls various processes of the MRI apparatus through the input device 221 while checking the display device 220.

The sequencer 204 operates under control of the CPU 208 and transmits various commands required for collecting data of tomographic images of the object 201 to the transmission system 205, the gradient magnetic field generating system 203, and the reception system 206 to control them. Hence, applying RF pulses and gradient magnetic field pulses and measuring echo signals generated by the object 201 are repeatedly executed based on a predetermined pulse sequence before imaging. The type and parameters of the pulse sequence are transferred to the sequencer 204 by the CPU 208. A slice direction gradient magnetic field pulse (Gs) is applied in a direction orthogonal to a slice plane (imaging cross section) to the gradient magnetic field during imaging, and the slice plane is set for the object 201. By applying a phase encoding direction gradient magnetic field pulse (Gp) and a frequency encoding direction gradient magnetic field pulse (Gf) are applying in the other two directions that are orthogonal to the slice plane and orthogonal to each other, positional information of the respective directions is encoded for the echo signals.

When data from the reception system 206 is input in the CPU 208 during imaging, the CPU 208 executes processes such as a predetermined signal processing and image reconstruction and generates tomographic images and the like of the object 201. The generated tomographic images and the like are displayed on the display device 220 and stored in the storage device 219 under control of the CPU 208.

Figure 7:
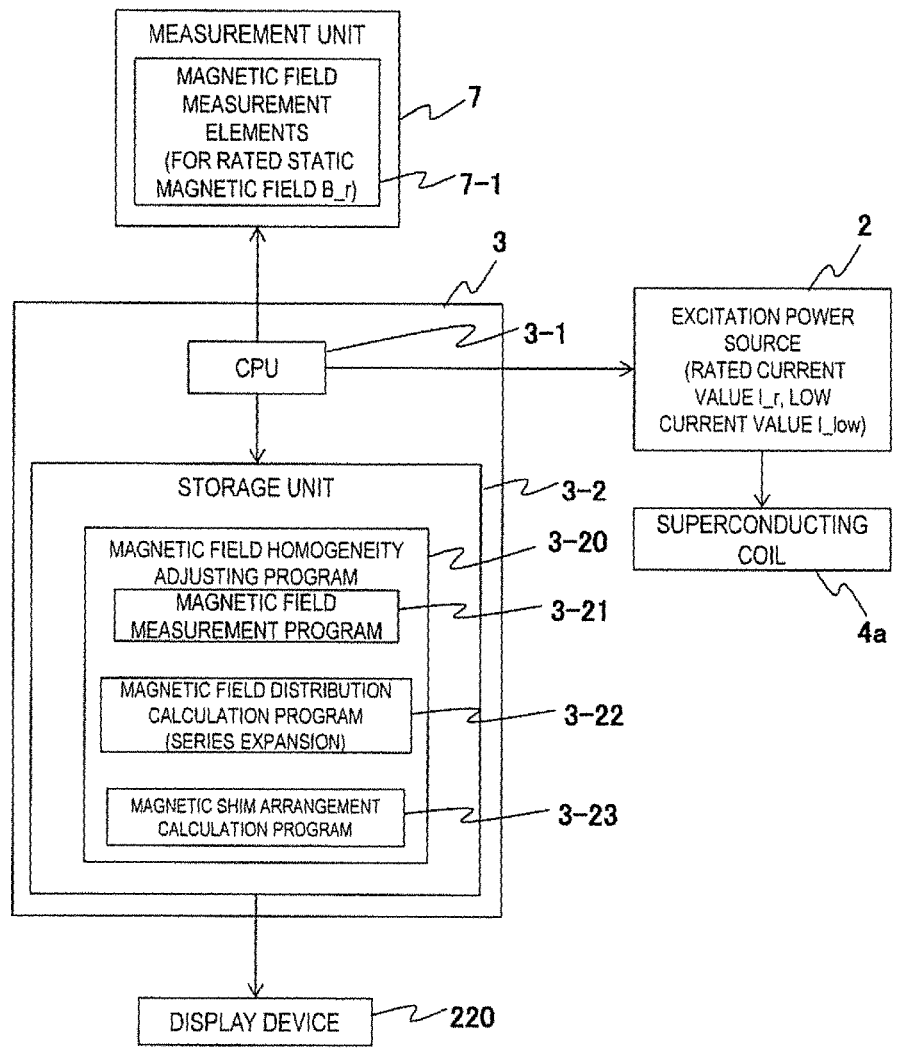
FIG. 7 is a block diagram showing a configuration of a calculation control unit 3 of the first embodiment.
Figure 8:
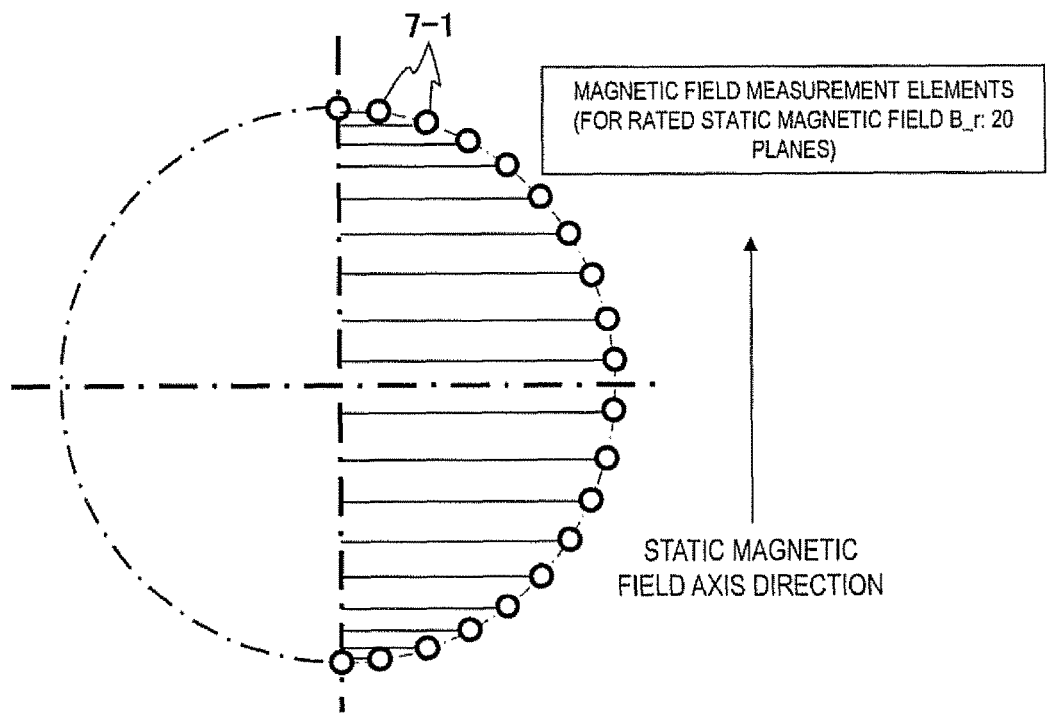
FIG. 8 is an explanatory diagram showing arrangement of magnetic field measurement elements 7-1 of a measurement unit 7 of the first embodiment.

The excitation power source 2, the measurement unit 7, and the calculation control unit 3 are used for exciting the superconducting coil 4a of the static magnetic field generating device 4 and adjusting a static magnetic field. As shown in FIG. 7, the excitation power source 2 is configured so as to be capable of supplying two types of excitation currents of the low current value I_low and the rated current value I_r that were described above. The measurement unit 7 is configured by arranging the magnetic field measurement elements 7-1 that can measure a rated static magnetic field B_r in a predetermined pattern (for example, 20 planes) corresponding to a shape of the imaging space 6 as shown in FIG. 8. By rotating the magnetic field measurement elements 7-1 of FIG. 8 around a static magnetic field axis direction 5, a rated static magnetic field B_r distribution can be measured.

The calculation control unit 3 includes a CPU 3-1 and a storage section 3-2 as shown in FIG. 7. A magnetic field homogeneity adjustment program 3-20 for achieving operations in the flow of FIG. 3 is previously stored in the storage section 3-2. The CPU 3-1 controls the excitation power source 2 to control an electric current value and imports output signals of the magnetic field measurement elements 7-1 of the measurement unit 7 by loading and executing the magnetic field homogeneity adjustment program 3-20.

The magnetic field homogeneity adjustment program 3-20 includes a magnetic field measurement program 3-21 for realizing magnetic field measurement in Step 18 of FIG. 3, a magnetic field distribution calculation program 3-22 for realizing calculation of a correction magnetic field distribution (series expansion) in Step 19, and a magnetic shim position calculation program 3-23 for calculating an arrangement of magnetic shims as the correction magnetic field distribution, and the CPU 3-1 loads and executes these programs respectively when operations of the respective Steps of FIG. 3 are executed. The operations of the respective Steps of FIG. 3 are as already described. The evaluated and calculated arrangement of magnetic shims is displayed on the display device 220, and an operator is prompted to mount the magnetic shims in the displayed arrangement.

Second Embodiment

A magnetic resonance imaging system of a second embodiment of the present invention has different operations of the calculation control unit 3 from the first embodiment. The calculation control unit 3 measures a static magnetic field distribution to evaluate a correction magnetic field distribution not only in a state of a rated static magnetic field B_r but also in a state of a low static magnetic field B_low before reaching the rated static magnetic field B_r.

Figure 9:
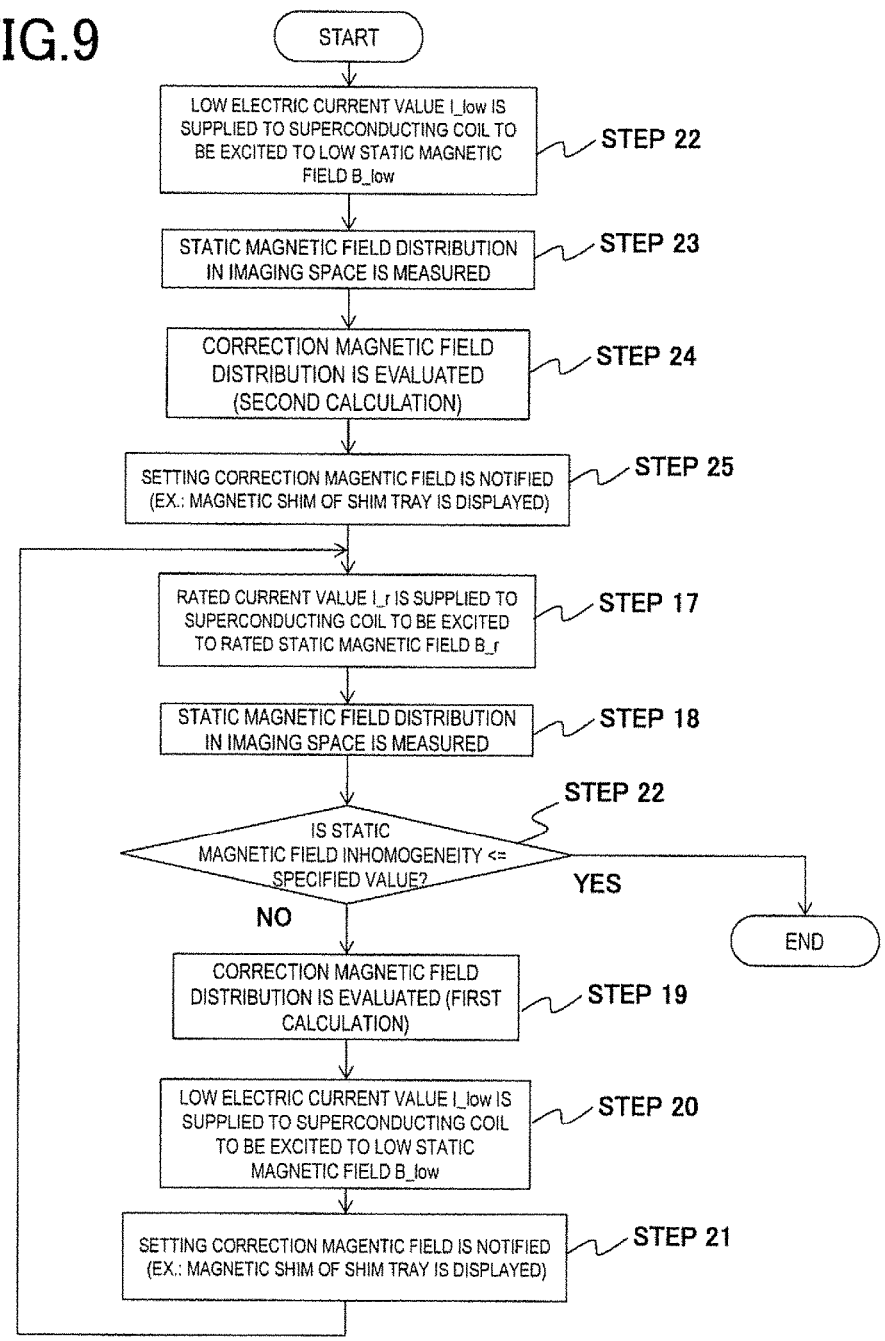
FIG. 9 is a flow chart showing operations of the calculation control unit of a second embodiment.

As shown in the flow of FIG. 9 and the graph illustrating the changes of the static magnetic field of FIG. 10(a), specifically, the calculation control unit 3 first supplies a low current value I_low from the excitation power source 2 to the superconducting coil 4a to be excited to a low static magnetic field B_low (Step 22). In this state, the calculation control unit 3 allows the measurement unit 7 to measure a static magnetic field distribution in an imaging space and imports output from the measurement unit 7 (Step 23). Based on the measured static magnetic field distribution, the calculation control unit 3 evaluates a distribution of a correction magnetic field that should be generated by the correction magnetic field generating unit 1 using second calculation (Step 24).

For example, a series expansion is performed on a distribution of the measured low static magnetic field B_low using a spherical surface harmonic function or the like in order to evaluate a correction magnetic field distribution based on the result. Then, an electric current of a low current value I_low flows in the superconducting coil 4a, and an operator is notified to set the correction magnetic field distribution of the correction magnetic field generating unit 1 to the correction magnetic field distribution evaluated by the second calculation in a state where the low static magnetic field B_low is generated (Step 25). For example, the correction magnetic field distribution is displayed on the display device 220. After the notification, the operator sets the correction magnetic field distribution for the correction magnetic field generating unit 1. Specifically, for example, the shim tray 13 is removed, magnetic shims are mounted, and then the shim tray 13 is attached again. This corrects static magnetic field inhomogeneity.

Then, Steps 17 to 21 similar to the first embodiment will be executed. That is, a rated current value I_r is excited to a rated static magnetic field B_r (Step 17), a static magnetic field distribution is measured (Step 18), and a correction magnetic field distribution is evaluated using the first calculation (Step 19). Then, the magnetic field is reduced to a low static magnetic field B_low (Step 20), and an operator is notified to set the correction magnetic field distribution of the correction magnetic field generating unit 1 to the correction magnetic field distribution evaluated by the first calculation (Step 21). These Steps 17 to 21 are repeated until a static magnetic field inhomogeneity measured in Step 18 is reduced to equal to or less than a specified value (Step 22).

Thus, in the second embodiment, because a correction magnetic field can be set when reaching a low static magnetic field B_low in Steps 22 to 25 of FIG. 9, static magnetic field inhomogeneity can be reduced before reaching a rated static magnetic field B_r as shown in FIG. 10(b). Therefore, comparing with FIGS. 4(a) and 4(b) of the first embodiment, the second embodiment can reduce static magnetic field inhomogeneity to equal to or less than a specified value in a much shorter time than the first embodiment. Because the configuration other than the calculation control unit 3 is similar to the first embodiment, the related description is omitted.

Figure 11:
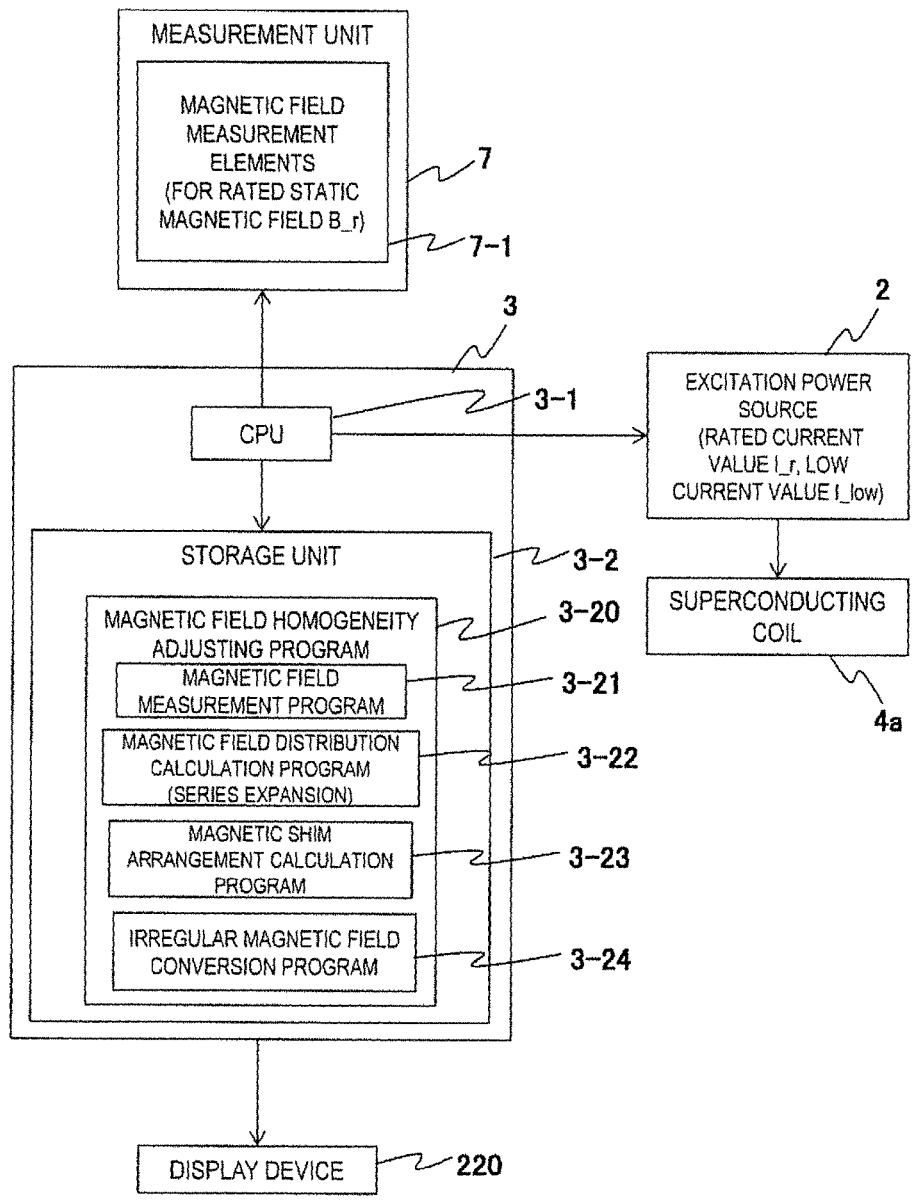
FIG. 11 is a block diagram showing a configuration of the calculation control unit 3 of the second embodiment.

Additionally, in Step 24 of FIG. 9, it is desired that the calculation control unit 3 evaluates an inhomogeneity of a rated static magnetic field B_r by calculation based on a measured low static magnetic field B_low. Therefore, as shown in FIG. 11, it is desired that the calculation control unit 3 previously stores an irregular magnetic field conversion program 3-24 that converts the static magnetic field inhomogeneity evaluated based on the low static magnetic field B_low into a static magnetic field inhomogeneity in the rated static magnetic field B_r in the storage section 3-2. Also, when a correction magnetic field distribution correcting a distribution inhomogeneity of the evaluated rated static magnetic field B_r by calculation, it is desired that the amount and the positions of magnetic shims are determined in consideration with that magnetic fields to be generated by the magnetic shims are different between the low static magnetic field B_low and the rated static magnetic field B_r. The above will be described below.

Because all the magnetic force generating sources of the static magnetic field generating device 4 are the superconducting coil 4a, it is assumed that static magnetic field inhomogeneity (hereinafter, referred to as an irregular magnetic field) is caused by component manufacturing and assembly accuracy of the superconducting coil 4a, and the description will be made.

A magnetic field strength of an irregular magnetic field component to be generated by the superconducting coil 4a is proportional to an electric current. That is, a relative display value to the central magnetic field (unit: ppm) becomes constant.

Figure 12:
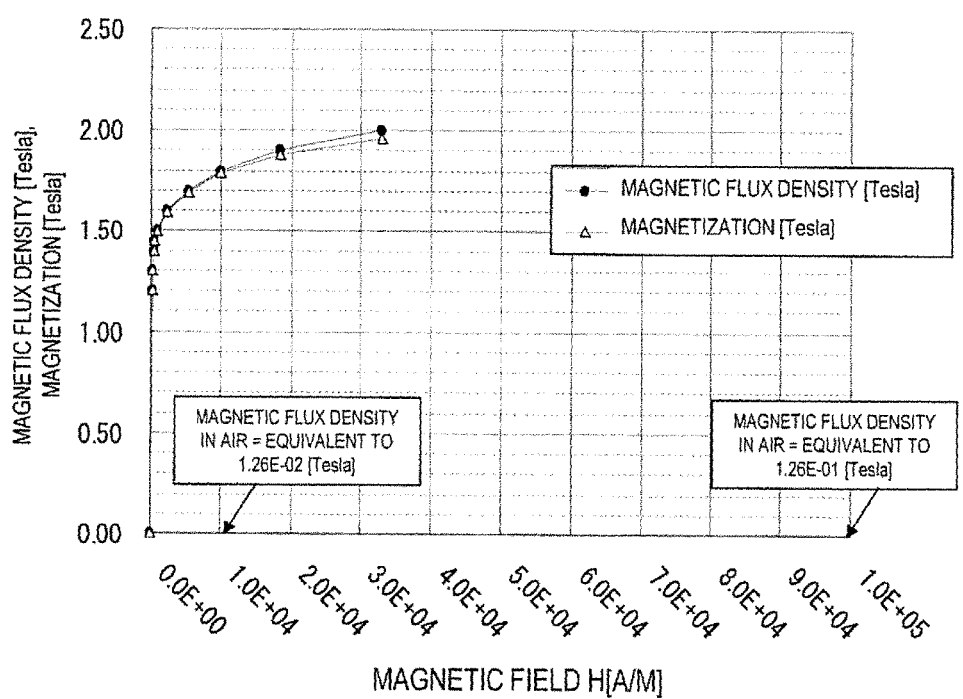
FIG. 12 is a graph showing magnetization characteristics (B-H characteristics) of a magnetic shim.

On the other hand, an electromagnetic steel sheet (silicon steel sheet) is used for the magnetic shims to be used for irregular magnetic field correction, and the magnetization characteristics (B-H characteristics) are, for example, as shown in FIG. 12. The magnetic flux density tends to be saturated from the vicinity of the magnetic field strength: $1 \times 10^4$ [A/m]. When $1 \times 10^4$ [A/m] is converted into a magnetic flux density in the air, the density is $1.26 \times 10^{-2}$ [Tesla]. A low static magnetic field B_low is previously set so as to be sufficiently greater than the magnetic field strength of $1.26 \times 10^{-2}$ [Tesla] at which the magnetic shims are saturated.

Specifically, when a strength of a rated static magnetic field B_r in the imaging space 6 is 3.0 [Tesla], a low static magnetic field B_low is set to 1.5 [Tesla] or 0.75 [Tesla]. Because these low static magnetic fields B_low is greater by two digits than $1.26 \times 10^{-2}$ [Tesla] at which magnetic shims are saturated, magnetic fields to be generated by the magnetic shims in the vicinity of the center of the imaging space 6 are approximately the same in a case of the rated static magnetic field B_r (=3.0 [Tesla]) and also in a case of the low static magnetic field B_low (for example, 1.5 or 0.75 [Tesla]).

Figure 13:
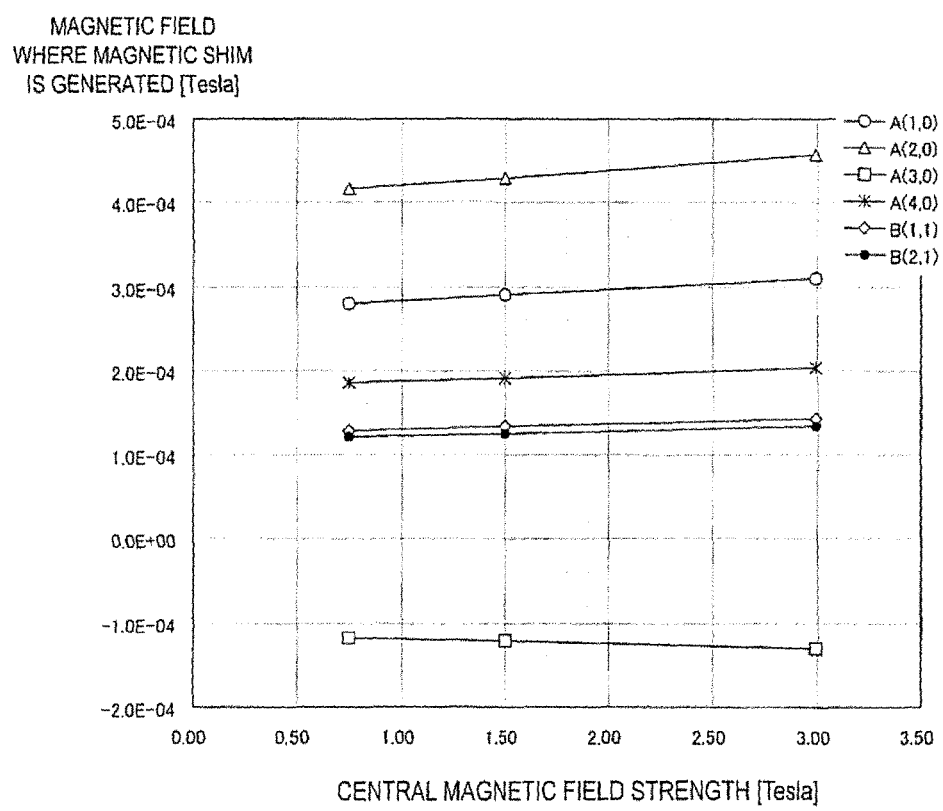
FIG. 13 is a graph showing a relationship between static magnetic field strengths in the center of the imaging space and magnetic fields that the magnetic shims generate.

FIG. 13 shows the results of correction magnetic field amounts calculated by calculator simulation in a case where magnetic shims in the same arrangement positions and with the same arrangement amounts generate the correction magnetic fields for the imaging space 6 with the central magnetic field strengths of 0.75 T, 1.5 T, and 3.0 T in the center of the imaging space 6. In FIG. 13, the respective magnetic field components (A (1, 0) to B (2, 1)) are numerical values in which an expansion coefficient term value for which a series expansion had been performed using a spherical surface harmonic function was converted into a magnetic field strength (Tesla) for the central magnetic field of 0.75 T, 1.5 T, and 3.0 T.

Additionally, the magnetic field component A indicates that it is rotationally symmetrical, and the magnetic field component B indicates that it is asymmetrical. The numerical value on the left in the parentheses represents a degree, and that on the right represents a rotational direction. As shown in FIG. 13, it is obvious that a strength value of a correction magnetic field to be generated by a magnetic shim is approximately the same in the imaging spaces of 0.75 T, 1.5 T, and 3.0 T. Additionally, the graph of the strengths of the magnetic fields generated by the magnetic shims in FIG. 13 is slightly gradient as the central magnetic field strength is changed to the imaging spaces of 0.75 T, 1.5 T, and the gradient is shown using 3.0 T $B=M+\mu_0 *H$, representing the magnetic field H and the term of $\mu_0$ ($\mu_0$: a vacuum permeability ($=4\pi \times 10^{-7}$)). Although the gradient can be theoretically compensated by a correction magnetic field, the present description is made by approximating a constant value.

Figure 14:
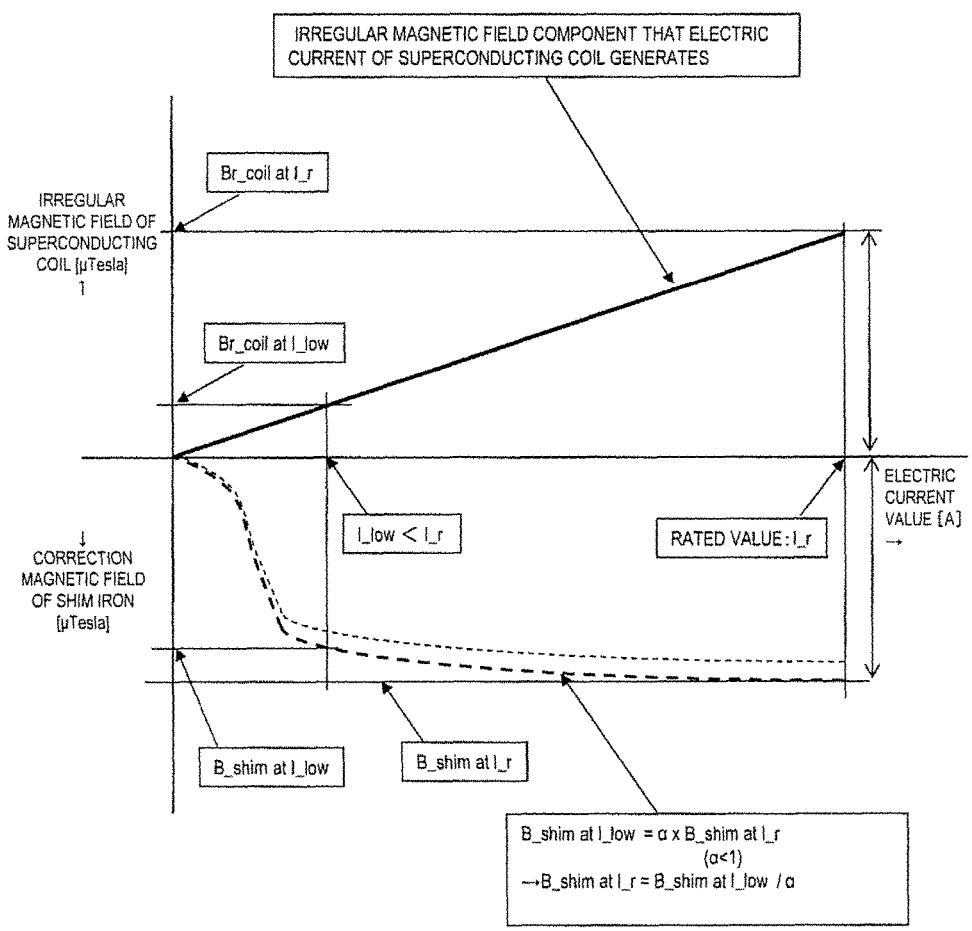
FIG. 14 is a graph showing a relationship between a value of an electric current to be supplied to a superconducting coil 4$a$ and an irregular magnetic field that the superconducting coil 4$a$ generates as well as a correction magnetic field that a shim iron generates.

FIG. 14 shows an example of a relationship between the amount of irregular magnetic fields to be generated by the superconducting coil 4a, the amount of correction magnetic fields to be generated by magnetic shims, and a value of an electric current to be supplied to the superconducting coil 4a. The amount of irregular magnetic fields to be generated by the superconducting coil 4a due to a position of the superconducting coil 4a and an assembling error is proportional to an electric current of the superconducting coil 4a. In contrast, the amount of correction magnetic fields to be generated by magnetic shims is rapidly increased to an electric current value Is, at which magnetization of the magnetic shims is approximately saturated, as a value of the electric current to be supplied to the superconducting coil 4a is increased, the amount does not considerably change when the value exceeds the electric current value Is and approximates to the amount of the correction magnetic fields of the magnetic shims at a rated current value I_r. As described using FIG. 12, because a value of the low static magnetic field B_low is set so as to be sufficiently greater than a magnetic field where the magnetic shims are saturated, a low current value I_low, at which the low static magnetic field B_low is generated, is sufficiently greater than the electric current value Is for the saturation.

Therefore, in FIG. 14, it is found that correction magnetic fields to be generated by the magnetic shims are approximately the same in a case of a low current value I_low generating a static magnetic field B_low and also in a case of a rated current value I_s generating a rated static magnetic field B_r.

Hence, in Step 24 of FIG. 9, the calculation control unit 3 can use a relationship where an irregular magnetic field of the superconducting coil 4a and the amount of magnetic fields to be generated by the magnetic shims are changed as described above in a low static magnetic field B_low and a rated static magnetic field B_r, evaluate a distribution inhomogeneity of the rated static magnetic field B_r based on the measured low static magnetic field B_low, and determine the amount and the arrangement of the magnetic shims. Specifically, in Step 24, the calculation control unit 3 performs a series expansion for the measurement result measured in Step 23 using a spherical surface harmonic function in order to calculate the amount of irregular magnetic fields in the low static magnetic field B_low. Here, a magnetic field generated by a ferromagnet located around a static magnetic field generating device (environmental magnetic field) is assumed as zero for simplification.

As shown in FIG. 14, because the amount of irregular magnetic fields to be generated by the superconducting coil 4a due to a position of the superconducting coil 4a and an assembling error is proportional to an electric current of the superconducting coil 4a, the amount of irregular magnetic field in a rated static magnetic field B_r can be calculated by multiplying B_r/B_low by the amount of irregular magnetic fields in a low static magnetic field B_low.

On the other hand, because magnitudes of the magnetic fields to be generated by the magnetic shims are approximately the same in a case of a low static magnetic field B_low and also in a case of a rated static magnetic field B_r, the publicly known calculation should be used to calculate the amount and the arrangement of the magnetic shims for correcting the amount of irregular magnetic fields in the rated static magnetic field B_r evaluated by the above calculation.

The evaluated amount and the evaluated arrangement of the magnetic shims are notified to an operator in Step 25 of FIG. 9, and the shim tray 13 is removed in a state where a low static magnetic field B_low is being generated in order to set the magnetic shims. When the arrangement of the magnetic shims in Step 25 is confirmed by the operation of the input device 221 from the operator for example, the calculation control unit 3 proceeds to Step 17 to be excited to a rated static magnetic field B_r and measures a static magnetic field distribution in Step 18.

Figure 15:
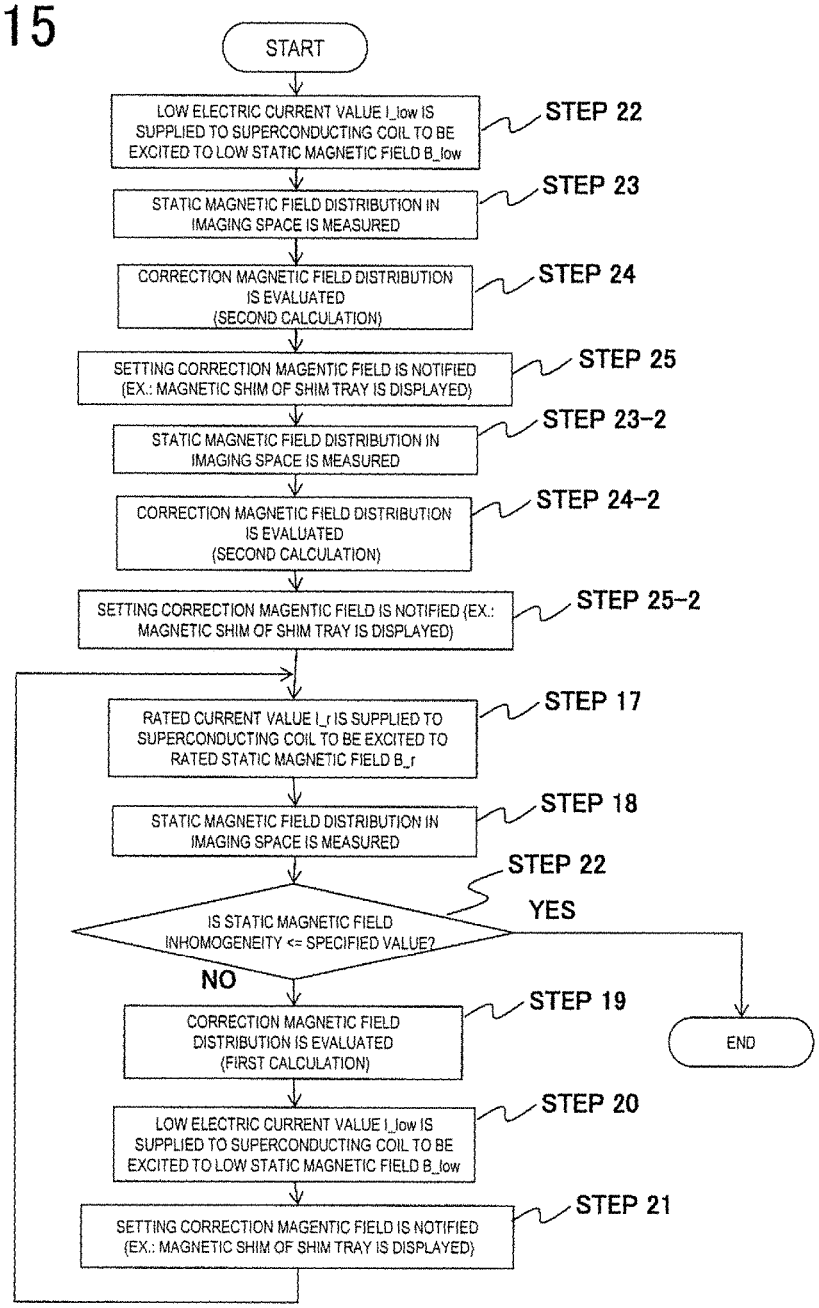
FIG. 15 is a flow chart showing another example of the operations of the calculation control unit of the second embodiment.

Additionally, in order to minimize error factors such as a magnetization error of the magnetic shims, misarrangement of the magnetic shims (a human error), and a measurement error, as shown in FIG. 15, the calculation control unit 3 may again measure a static magnetic field distribution in the imaging space 6 in a state where a low static magnetic field B_low is being generated before proceeding Step 17 after the magnetic shims are arranged by an operator in Step 25 (Step 23-2).

Hence, a static magnetic field distribution after the magnetic shim arrangement can be measured. An irregular magnetic field in a rated static magnetic field B_r is calculated similarly to the above Step 24 from the measured static magnetic field distribution, the amount and the positions of the magnetic shims are evaluated again by calculation from the calculated irregular magnetic field (Step 24-2). The calculated amount and positions are notified to an operator similarly to Step 25 (Step 25-2). Therefore, because errors can be corrected for a magnetization error of the magnetic shims mounted in a state of a low static magnetic field B_low before being excited to the rated static magnetic field B_r by proceeding to Step 17 and taking a long time, misarrangement of the magnetic shims (a human error), and a measurement error, static magnetic field inhomogeneity after being excited to the rated static magnetic field B_r can be reduced more, which can efficiently adjust static magnetic field homogeneity. Thus, the number of times of repeating Steps 17 to 21 required to reduce the static magnetic field inhomogeneity to equal to or less than a specified value can be reduced.

Additionally, the static magnetic field generating device 4 may include not only the superconducting coil 4a but also a ferromagnet that is generally referred to as a magnetic ring and supplementarily compensates the static magnetic field and a static magnetic field compensating means. In this case, an irregular magnetic field of the static magnetic field generating device 4 needs to add an irregular magnetic field of the magnetic ring to an irregular magnetic field of the superconducting coil 4a of FIG. 14, and the irregular magnetic field strength is not proportional to the static magnetic field strength.

In such a case, an irregular magnetic field to be generated by the static magnetic field generating device 4 provided with a magnetic ring is previously evaluated for a rated static magnetic field B_r and a low static magnetic field B_low by calculator simulation, an experiment, or the like, and a relationship between the irregular magnetic fields in the low static magnetic field B_low and the rated static magnetic field B_r (such as a coefficient and a numerical formula) is calculated in advance. In Steps 24 and 24-2 of FIGS. 9 and 15, an irregular magnetic field in the rated static magnetic field B_r is calculated based on the above relationship and an irregular magnetic field in the low static magnetic field B_low evaluated from the measured static magnetic field distribution.

Similarly, the irregular magnetic field strength is not also proportional to the static magnetic field strength when a ferromagnet such as a construction material is located around a magnet, is magnetized by a leakage magnetic field of the static magnetic field generating device 4, and is generating an environmental magnetic field. In such a case, similarly to the case of a magnetic ring, it is desired that an irregular magnetic field in the rated static magnetic field B_r is calculated based on the above relationship and an irregular magnetic field in the low static magnetic field B_low evaluated from the measured static magnetic field distribution in Steps 24 and 24-2 of FIGS. 9 and 15 after a relationship between the irregular magnetic fields in the low static magnetic field B_low and the rated static magnetic field B_r (such as a coefficient and a numerical formula) is calculated in advance by calculator simulation, an experiment, or the like.

Also, although measurement of a static magnetic field distribution and setting for a correction magnetic field (arrangement of magnetic shims) in the above-described second embodiment are performed in a low static magnetic field a strength of the low static magnetic field B_low qualitatively has the following characteristics:

1) When the strength of the low static magnetic field B_low is closer to a strength of a rated static magnetic field B_r (a magnetic field strength is high), the amount of irregular magnetic fields in the rated static magnetic field B_r can be calculated more accurately.

and, on the other hand,

2) When the strength of the low static magnetic field B_low is sufficiently lower than the rated static magnetic field B_r, an electromagnetic attraction force to be applied to a magnetic shim member is small, which improves efficiency in mounting the magnetic shims.

Therefore, in consideration with the above 1) and 2), Step 22 of FIG. 9 can also be configured to set a magnetic field strength to two-thirds of a rated static magnetic field B_r as a low static magnetic field B_low, measure a static magnetic field distribution, evaluate the correction amount of magnetic fields (Steps 23 and 24), set a magnetic field strength to one-third of the rated static magnetic field B_r that is smaller than the low static magnetic field B_low of Step 22 as the low static magnetic field B_low before Step 25, and notify and prompt an operator to mount the magnetic shim (Step 25).

Figure 16:
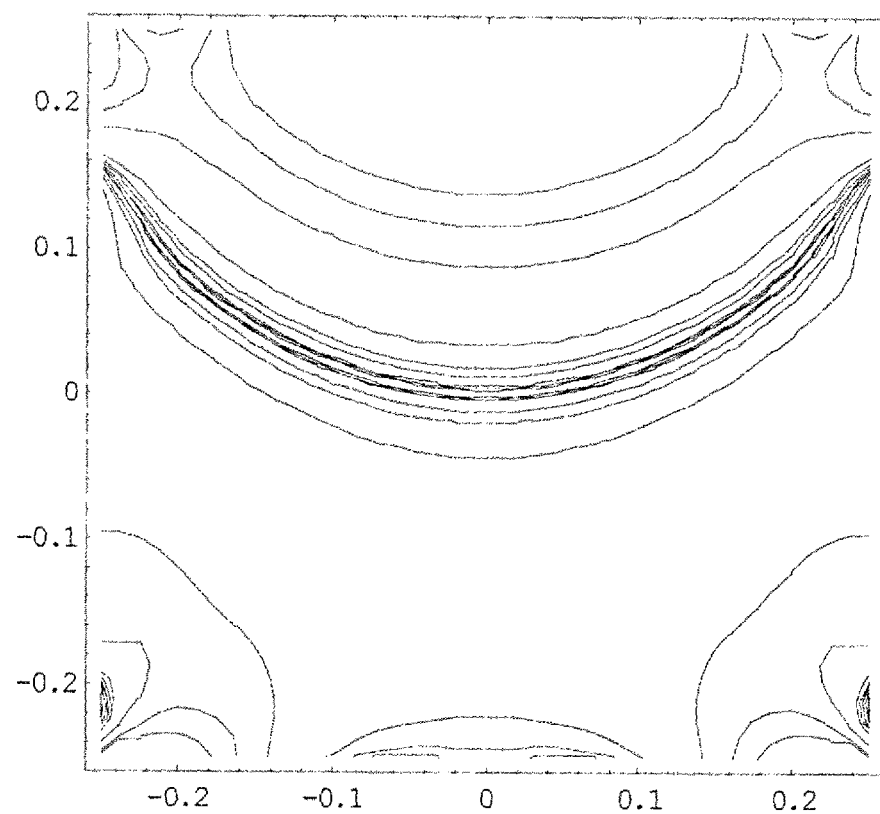
FIG. 16 is a graph showing a distribution of low order terms of a static magnetic field distribution measured in the second embodiment.
Figure 17:
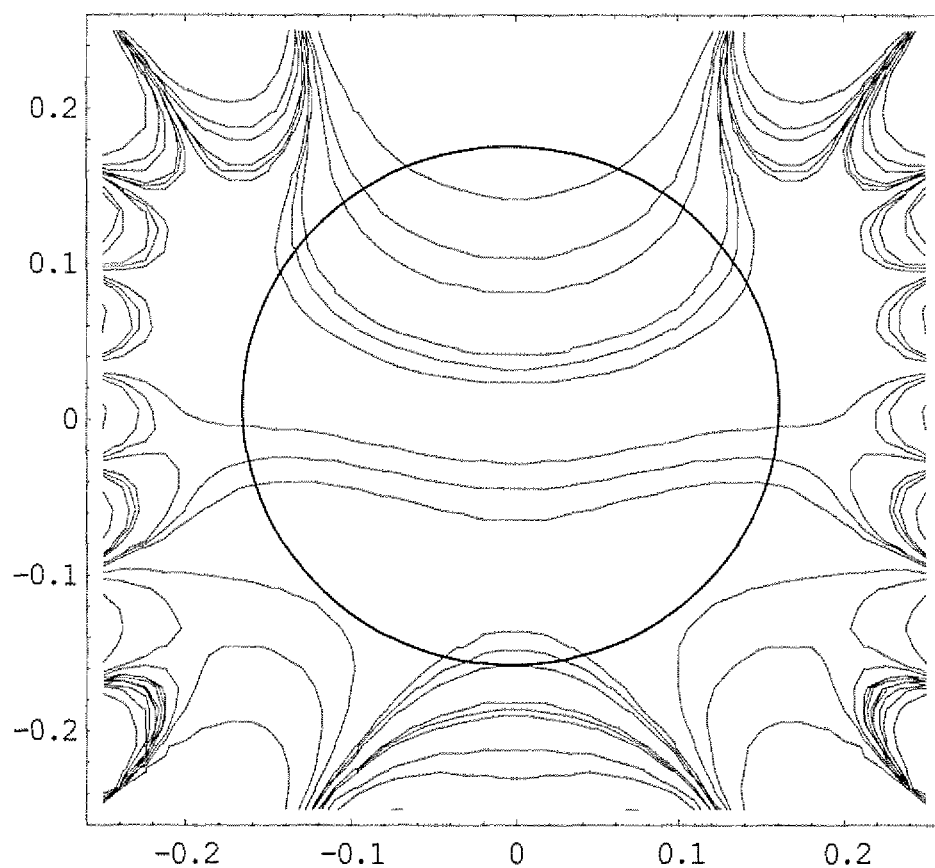
FIG. 17 is a graph showing a static magnetic field distribution in a state where the static magnetic field distribution of low order terms in FIG. 16 was corrected.
Figure 18:
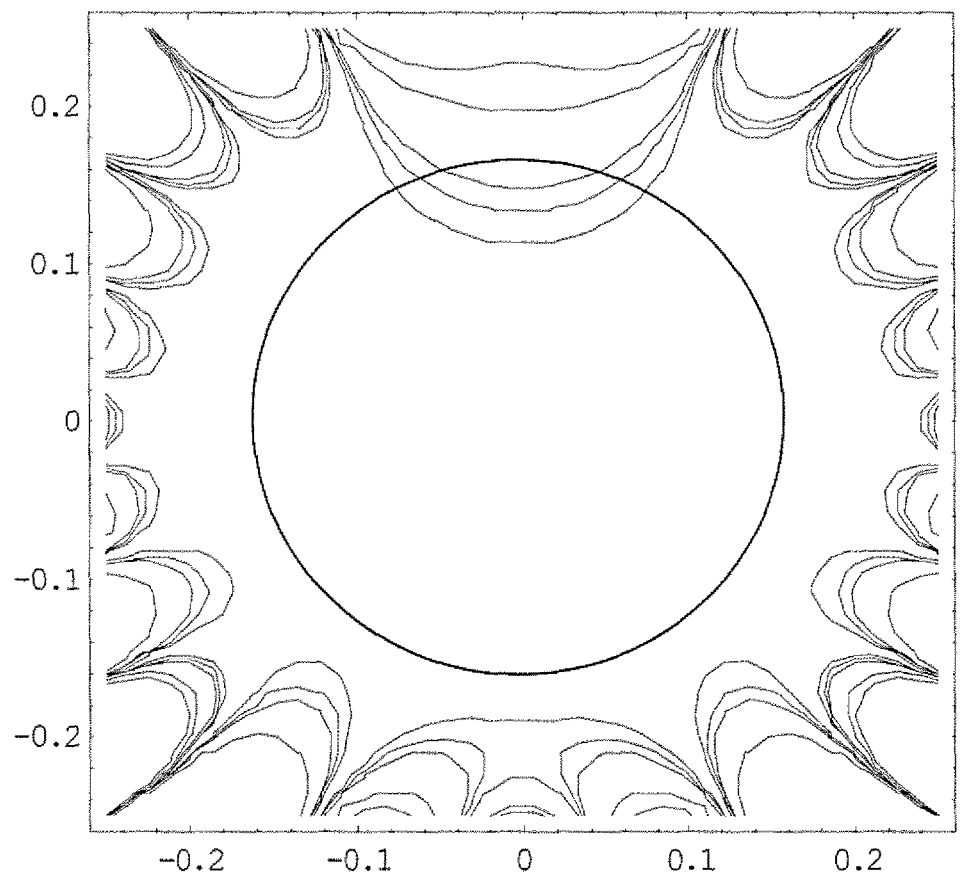
FIG. 18 is a graph showing a static magnetic field distribution in a state where those other than a design series of the static magnetic field distribution in FIG. 16 are completely corrected.

Additionally, although irregular magnetic field components is evaluated by a series expansion such as a spherical surface harmonic function in Step 24, values of low order terms tend to be greater than those of high order terms from among the irregular magnetic field components in an irregular magnetic field to be generated by the static magnetic field generating device 4. Hence, in order to reduce a total static magnetic field inhomogeneity, for example, a peak-to-peak value of 45-50 cm sphere, it is effective to reduce the irregular magnetic field components of the low order terms. Therefore, in Step 24 of FIG. 9, in order to reduce the irregular magnetic field components, the arrangement amount and the positions of the magnetic shim members may be calculated so as to reduce low order terms by performing the series expansion such as the spherical surface harmonic function to select only the low order terms (such the first to fourth order terms). FIGS. 16 to 18 show the transitions of a magnetic field distribution in a static magnetic field homogeneous space at this time.

FIG. 16 shows the Z1st to Z4th terms of the irregular magnetic field components evaluated by calculation in Step 24, Z1 to Z3 are approximately 100 ppm respectively, and Z4 is approximately 20 ppm. FIG. 17 shows a magnetic field distribution in a case where magnetic shims correct Z1 to Z4 by approximately 90%. FIG. 18 shows a magnetic field distribution in a static magnetic field homogeneous space after completing static magnetic field adjustment and reaching a specification value. A static magnetic field homogeneity in this case indicates 15 ppm (peak-to-peak value) on a 50 cm spherical surface. Also, FIG. 18 shows a case where the number of turns of the superconducting coil 4a (or a magnetic ring) that generates a main magnetic field of the above static magnetic field generating device 4 is five to six.

At this time, irregular magnetic field components of approximately the Z10 term or more remains in the superconducting coil 4a in an ideal state in designing, i.e. a state where there are no irregular magnetic field components caused by a manufacturing error or the like. The irregular magnetic field components of higher-order components (for example, the Z10th term or more) have a characteristic of being attenuated in inverse proportion to the N-th power (10-th power in a case of the Z10th term) of the distance from a main magnetic field generating source (for example, the above superconducting coil 4a) and result in an ignorable amount in an imaging space area (such as a 50 cm spherical surface).

Figure 19:
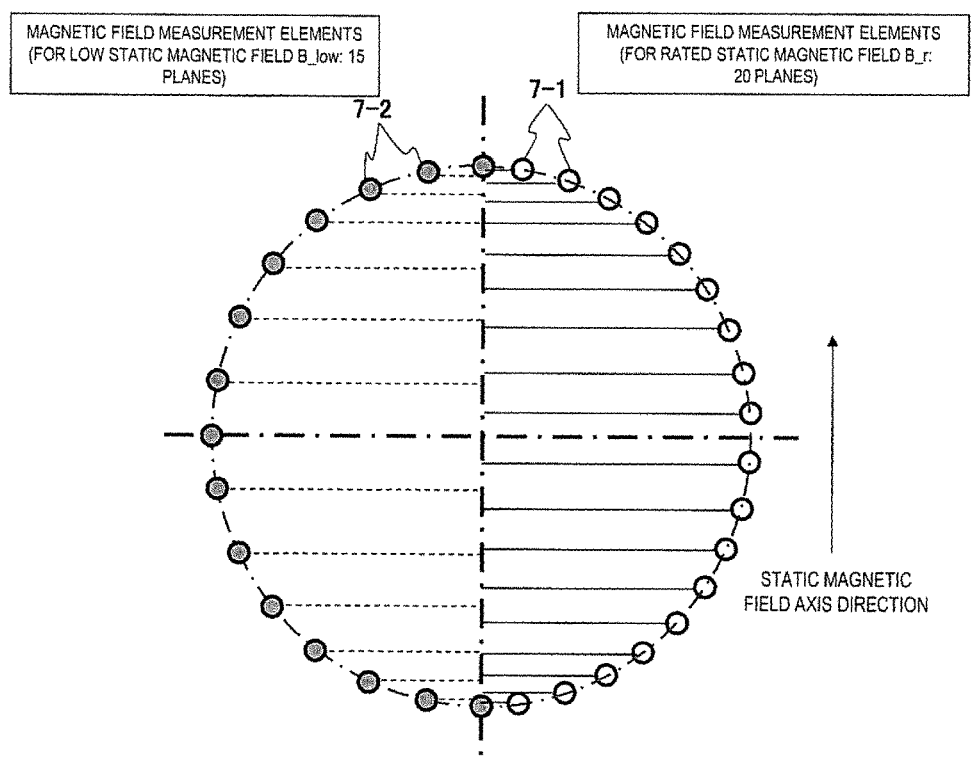
FIG. 19 is an explanatory diagram showing arrangement of magnetic field measurement elements 7-1 and 7-2 of the measurement unit 7 of the second embodiment.

Similarly, considering that values of low order terms are greater than those of high order terms in an irregular magnetic field and that it is effective to reduce the irregular magnetic field of the low order terms in order to reduce the irregular magnetic field, as the measurement unit 7 to be used for measuring a static magnetic field distribution of the low static magnetic field B_low of Step 23 in FIG. 9, a measurement unit whose number of measurement elements (number of planes) is less than the measurement unit 7 to be used for measuring a static magnetic field distribution of the rated static magnetic field B_r in Step 18 may be used. For example, as shown in FIG. 19, using the measurement unit 7 comprising both of magnetic field measurement elements 7-1 of 20 to 24 planes (FIG. 19 shows a case of 20 planes) for the rated static magnetic field B_r and magnetic field measurement elements 7-2 of 15 planes for the low static magnetic field B_low, the calculation control unit 3 can be configured so as to selectively import either detection result from the magnetic field measurement elements 7-1 and the magnetic field measurement elements 7-2.

Figure 20:
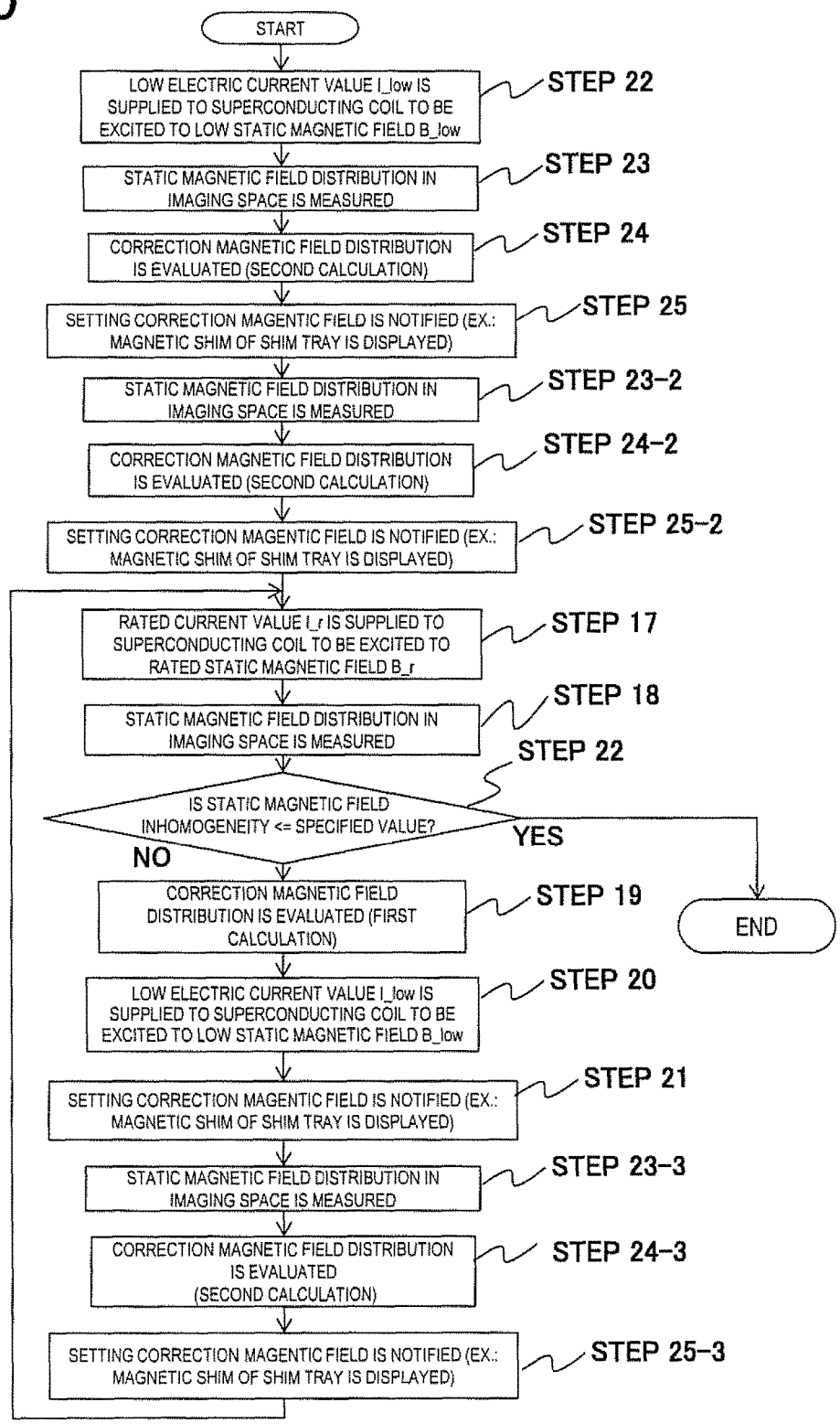
FIG. 20 is a flow chart showing the other example of the operations of the calculation control unit of the second embodiment.

The above-described second embodiment is configured so as to measure a static magnetic field in a low static magnetic field B_low only for the first time (Steps 22 to 25 in FIG. 9) and measure a static magnetic field only in a rated static magnetic field B_r in Steps 17 to 21 of repeating the rated static magnetic field B_r and the low static magnetic field B_low. However, the present invention is not limited to this configuration, and Steps 23-3, 23-4, and 23-5 similar to Steps 23, 24, and 25 in FIGS. 9 and 15 may be performed as shown in FIG. 20 after Steps 17 to 21. Hence, an operator can check whether or not there are errors of the arranged magnetic shims and correct them by notification of Step 21, which can reduce the number of repeating times of Steps 17 to 21 required to reduce a static magnetic field inhomogeneity to equal to or less than a specified value. Additionally, it is possible to omit Step 23-2 in FIG. 20.

Third Embodiment

Figure 21:
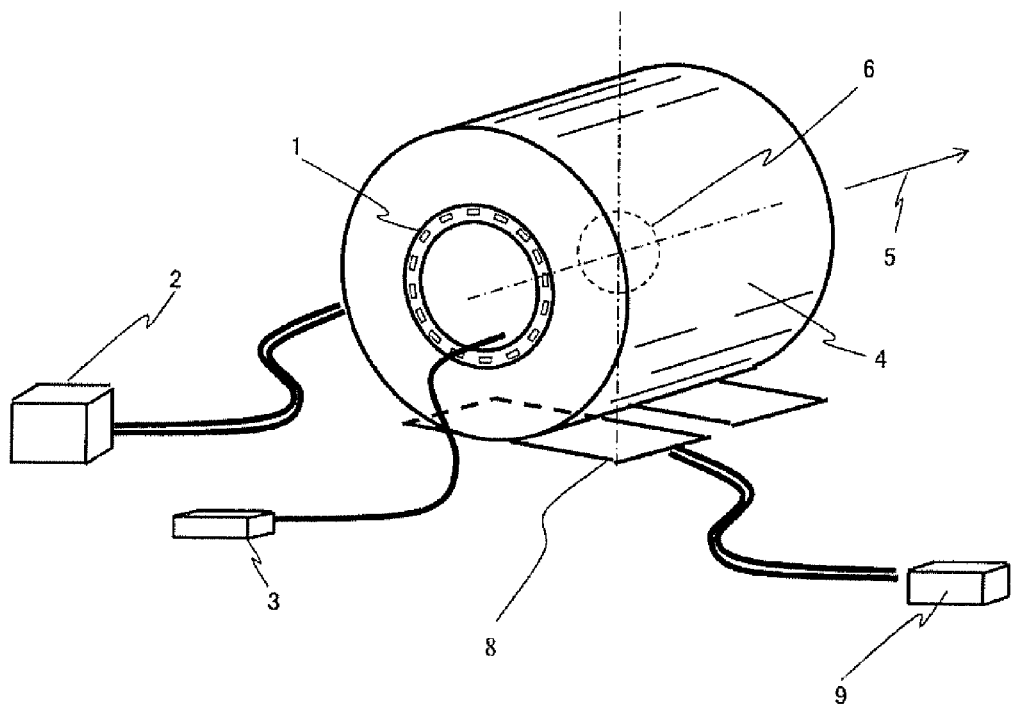
FIG. 21 is a perspective view of a static magnetic field generating device 4 and an external magnetic field generating unit 8 of a third embodiment.

In the third embodiment, in order to accurately measure a magnetic field to be generated by a ferromagnet located around a magnet in a low static magnetic field B_low, the external magnetic field generating unit 8 is disposed outside the static magnetic field generating device 4 as shown in the perspective view in FIG. 21. The external magnetic field generating unit 8 generates a magnetic field to the periphery of the static magnetic field generating device 4 in order to equalize a leakage magnetic field to the periphery of the static magnetic field generating device 4 in a state of the low static magnetic field B_low where an electrical current at a low current value I_low is flowing in the superconducting coil 4a to a leakage magnetic field in a state of a rated static magnetic field B_r where an electrical current at a rated current value I_r is flowing in the superconducting coil 4a.

Hence, in Step 23 of FIG. 9 etc. at which a static magnetic field distribution is measured in the low static magnetic field B_low that is smaller than the rated static magnetic field B_r, a problem, in which the leakage magnetic field from the static magnetic field generating device 4 becomes smaller, a ferromagnet located around a magnet is less magnetized compared to a case of the rated static magnetic field B_r consequently, and the irregular magnetic field is also weakened, is not caused. Therefore, in Step 24, an irregular magnetic field in the rated static magnetic field B_r can be more accurately evaluated from the irregular magnetic field measured in the low static magnetic field B_low.

The external magnetic field generating unit 8 is configured to include a coil with a plurality of turns. The coil with a plurality of turns is connected to an external magnetic field generating unit power source 9 that supplies an electric current. The external magnetic field generating unit power source 9 is controlled by the calculation control unit 3.

Figure 22:
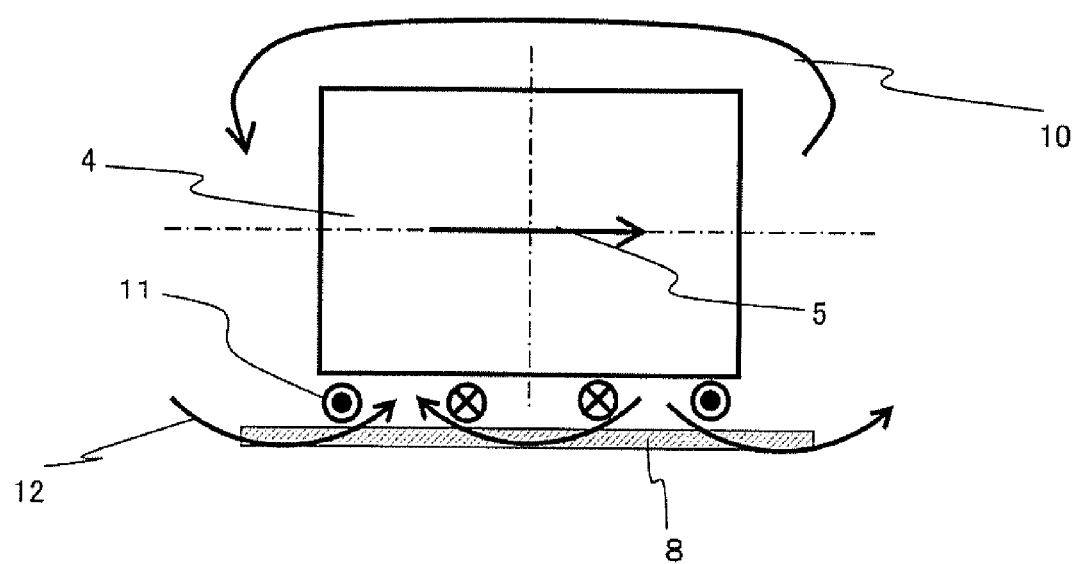
FIG. 22 is an explanatory diagram showing orientations of a leakage magnetic field of the static magnetic field generating device 4 of the third embodiment and electric currents of coils of the external magnetic field generating unit 8.
Figure 23:
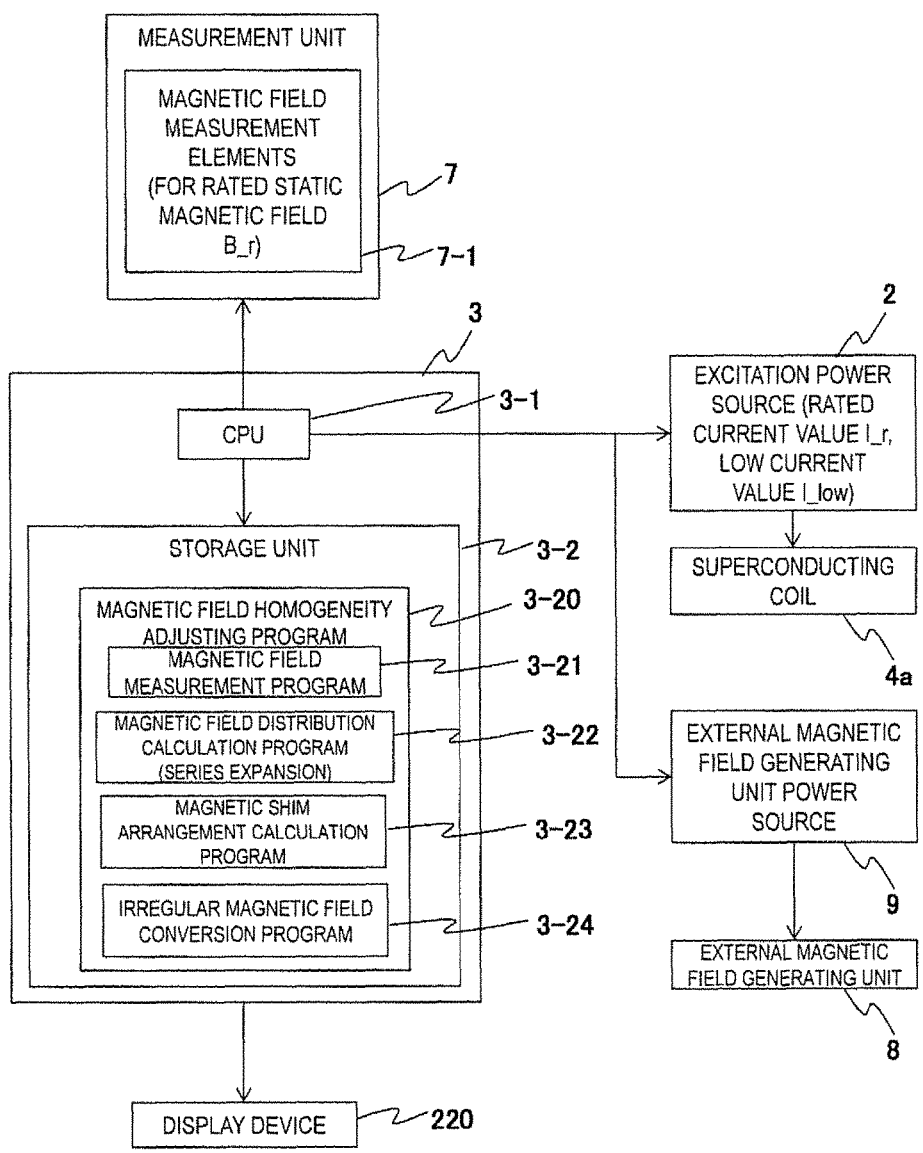
FIG. 23 is a block diagram showing configurations of the calculation control unit 3 and an external magnetic field generating unit 9 of the third embodiment.

FIG. 21 shows an example where the external magnetic field generating unit 8 is disposed between the cylindrical static magnetic field generating device 4 and the floor surface portion. FIG. 22 shows an electric current direction of the coil of the external magnetic field generating unit 8. FIG. 23 is a block diagram of a part of the MRI apparatus of the third embodiment.

As shown in FIG. 22, leakage magnetic fields of the cylindrical static magnetic field generating device 4 have a greater intensity in a first-order component 10 that is emitted parallel to an axial direction 5 of a static magnetic field from an end surface side of the inner space of the static magnetic field generating device 4 and a third-order component 12 in the vicinity of a superconducting magnet. A shape and an orientation of the external magnetic field generating unit 8 and a direction 11 of an electric current to be supplied are designed so as to generate a magnetic field distribution equivalent to the leakage magnetic fields (10 and 12) in a rated static magnetic field B_r, for which calculator simulation or actual measurement was previously performed, also in a low static magnetic field B_low. Also, the calculation control unit 3 controls a value of an electric current to be supplied from the external magnetic field generating unit power source 9 to the external magnetic field generating unit 8.

When instructing to supply an electrical current at a low current value I_low to the excitation power source 2 to set a low static magnetic field B_low in Steps 22, 22-2, and 22-3 of FIG. 9 etc., the calculation control unit 3 instructs to simultaneously supply a predetermined electric current to the external magnetic field generating unit power source 9 and the coil of the external magnetic field generating unit 8. Hence, a leakage magnetic field to the periphery of the static magnetic field generating device 4 in a state of a low static magnetic field B_low can be equalized to a leakage magnetic field in a state of a rated static magnetic field B_r where an electrical current at a rated current value I_r is flowing in the superconducting coil 4a.

Because the other configuration of the MRI apparatus of the third embodiment is similar to the first and second embodiments, the related description is omitted.

According to the third embodiment, because an irregular magnetic field in a rated static magnetic field B_r can be more accurately evaluated from an irregular magnetic field measured in a low static magnetic field B_low in Step 24 etc. of FIG. 9 etc., accuracy in static magnetic field adjustment is improved by magnetic shims, which can reduce the number of repeating times of Steps 17 to 21 to reduce a static magnetic field inhomogeneity to equal to or less than a specified value. Therefore, the static magnetic field adjustment can be performed in a short time.

According to the first to third embodiments described above, all the processes of the magnetic field adjustment is shortened, the number of times of demagnetization and excitation accompanied by quenching and waste of liquid helium is limited to the minimum, and the number of man-hours required for a coarse adjustment step is reduced, which can improve a fine adjustment step. Therefore, an MRI system that can reduce time and cost required for the magnetic field adjustment is provided.

Also, the static magnetic field adjustment process can be performed at a high efficiency, and a highly homogeneous static magnetic field space is achieved, which can provide an MRI apparatus with high image quality. Furthermore, it is advantageous that the delivery time can be reduced because the magnetic field adjustment is simplified in a final installation site.

REFERENCE SIGNS LIST

1: correction magnetic field generating unit
2: excitation power source
3: calculation control unit
4: static magnetic field generating device
4a: superconducting coil
6: imaging space
7: measurement unit
7-1: magnetic field measurement elements
8: external magnetic field generating unit
9: external magnetic field generating unit power source
10: leakage magnetic field (first-order component)
12: leakage magnetic field (third-order component)
13: shim trays
14: shim tray holder

The invention claimed is:

1. A magnetic resonance imaging system comprising:
a static magnetic field generating device that includes a superconducting coil and generates a static magnetic field in an imaging space where an object is placed;
a correction magnetic field generating unit that generates a correction magnetic field to reduce inhomogeneity of a static magnetic field distribution in the imaging space;
a measurement unit that measures the static magnetic field distribution in the imaging space;
an excitation power source that selectively supplies either of an electric current at a rated current value or an electric current at a predetermined (greater than zero) low current value smaller than the rated current value to the superconducting coil; and
a calculation control unit that evaluates a distribution of a correction magnetic field that should be generated by the correction magnetic field generating unit using calculation based on the static magnetic field distribution in the imaging space measured by the measurement unit,
wherein the calculation control unit supplies the electric current at the rated current value from the excitation power source to the superconducting coil, evaluates the distribution of the correction magnetic field that should be generated by the correction magnetic field generating unit using first calculation based on the static magnetic field distribution measured by the measurement unit in a state where the electric current at the rated current value is flowing in the superconducting coil, reduces the electric current value of the superconducting coil to the low current value using the excitation power source, notifies an operator to set the correction magnetic field of the correction magnetic field generating unit to the correction magnetic field distribution evaluated by the first calculation in a state where the electric current at the low current value is flowing in the superconducting coil, and repeats the above operations.

2. The magnetic resonance imaging system according to claim 1,
wherein, when the electric current value of the superconducting coil reaches the low current value before reaching the rated current value, the calculation control unit evaluates a distribution of the correction magnetic field that should be generated by the correction magnetic field generating unit using second calculation based on the static magnetic field distribution measured by the measurement unit in a state where the electric current at the low current value is flowing in the superconducting coil and notifies the operator to set the correction magnetic field of the correction magnetic field generating unit to the correction magnetic field distribution evaluated by the calculation control unit using the second calculation in a state where the electric current at the low current value is flowing in the superconducting coil.

3. The magnetic resonance imaging system according to claim 1,
wherein, when the operator sets the correction magnetic field distribution for the correction magnetic field generating unit after notification to the operator, the calculation control unit evaluates a distribution of the correction magnetic field that should be generated by the correction magnetic field generating unit using second calculation based on the static magnetic field distribution measured by the measurement unit in a state where the electric current at the low current value is flowing in the superconducting coil and notifies the operator to set the correction magnetic field of the correction magnetic field generating unit to the correction magnetic field distribution evaluated by the calculation control unit using the second calculation in a state where the electric current at the low current value is flowing in the superconducting coil.

4. The magnetic resonance imaging system according to claim 2,
wherein, when the correction magnetic field distribution is evaluated by the calculation control unit using the second calculation, the calculation control unit evaluates the inhomogeneity of the static magnetic field distribution in a state where the electric current at the rated current value is flowing in the superconducting coil and evaluates the distribution of the correction magnetic field based on the inhomogeneity of the evaluated static magnetic field distribution.

5. The magnetic resonance imaging system according to claim 1, wherein the correction magnetic field generating unit includes magnetic shims and one or more shim trays supporting the magnetic shims, the shim trays are detachably arranged in a position closer to the imaging space than the static magnetic field generating device, and the calculation control unit evaluates arrangement of the magnetic shims on the shim trays as the correction magnetic field distribution.

6. The magnetic resonance imaging system according to claim 5, wherein the low current value is set to a value at which the operator can attach and detach one of the shim trays, to which the magnetic shim were attached, in a static magnetic field to be generated by the superconducting coil in which the electric current at the low current value flows.

7. The magnetic resonance imaging system according to claim 5, wherein the low current value is set to a value at which an electromagnetic attraction force to be applied to one of the shim trays attached to the magnetic shims is more than 0 kg and equal to or less than 5 kg, by a static magnetic field to be generated by the superconducting coil in which the electric current at the said low current value flows.

8. The magnetic resonance imaging system according to claim 2, wherein the measurement unit includes measurement elements for a rated static magnetic field that measure a static magnetic field distribution in a state where the electric current at the rated current value is flowing in the superconducting coil and measurement elements that measure a static magnetic field distribution in a state where the electric current at the low current value is flowing.

9. The magnetic resonance imaging system according to claim 2, wherein an external magnetic field generating unit that generates a magnetic field to a periphery of the static magnetic field generating device is further included in order to equalize a leakage magnetic field to the periphery of the static magnetic field generating device in a state where the electrical current at the low current value is flowing in the superconducting coil, to a leakage magnetic field in a state where the electrical current at the rated current value is flowing in the superconducting coil.

10. A static magnetic field homogeneity adjusting system comprises:

a measurement unit that includes a superconducting coil and measures a static magnetic field distribution in an imaging space of a static magnetic field generating device that generates a static magnetic field in the imaging space where an object is placed;

an excitation power source that selectively supplies either of an electric current at a rated current value or an electric current at a predetermined (greater than zero) low current value smaller than the rated current value to the superconducting coil; and a calculation control unit that evaluates a distribution of a correction magnetic field that should be generated by a correction magnetic field generating unit disposed in a vicinity of the imaging space, by calculation based on the static magnetic field distribution in the imaging space measured by the measurement unit, in order to reduce inhomogeneity of a static magnetic field distribution in the imaging space, wherein the calculation control unit supplies the electric current at the rated current value from the excitation power source to the superconducting coil, evaluates the distribution of the correction magnetic field that should be generated by the correction magnetic field generating unit using first calculation based on the static magnetic field distribution measured by the measurement unit in a state where the electric current at the rated current value is flowing in the superconducting coil, reduces the electric current value of the superconducting coil to the low current value using the excitation power source, notifies an operator to set a correction magnetic field of the correction magnetic field generating unit to the correction magnetic field distribution evaluated by the calculation control unit using the first calculation in a state where the electric current at the low current value is flowing in the superconducting coil, and repeats the above operations.

11. The static magnetic field homogeneity adjusting system according to claim 10, wherein, when the electric current of the superconducting coil reaches the low current value before reaching the rated current value, the calculation control unit evaluates a distribution of the correction magnetic field that should be generated by the correction magnetic field generating unit using second calculation based on the static magnetic field distribution measured by the measurement unit in a state where the electric current at the low current value is flowing in the superconducting coil and notifies the operator to set the correction magnetic field of the correction magnetic field generating unit to the correction magnetic field distribution evaluated by the calculation control unit using the second calculation in a state where the electric current at the low current value is flowing in the superconducting coil.

12. The static magnetic field homogeneity adjusting system according to claim 10, wherein an external magnetic field generating unit that generates a magnetic field to a periphery of the static magnetic field generating device is further included in order to equalize a leakage magnetic field to the periphery of the static magnetic field generating device in a state where the electrical current at the low current value is flowing in the superconducting coil, to a leakage magnetic field in a state where the electrical current at the rated current value is flowing in the superconducting coil.

13. A magnetic field homogeneity adjusting method of a static magnetic field generating device repeatedly performing the following steps:

a first step in which a static magnetic field inhomogeneity in an imaging space is measured in a state where an electric current at a rated current value is flowing in a superconducting coil of the static magnetic field generating device;

a measurement step in which a static magnetic field distribution in the imaging space is measured;

a second step in which a distribution of a correction magnetic field that should be generated by a correction magnetic field generating unit disposed in a vicinity of the imaging space is evaluated by a calculation control unit using calculation based on the static magnetic field distribution measured in the measurement step; and a third step in which the electric current value of the superconducting coil is reduced to a predetermined (greater than zero) low current value smaller than the rated current value and notifies an operator to set a correction magnetic field of the correction magnetic field generating unit to the correction magnetic field evaluated by the calculation control unit using the calculation in a state where the electric current at the low current value is flowing in the superconducting coil.

14. The magnetic field homogeneity adjusting method of the static magnetic field generating device according to claim 13, performing the following steps:
- a 1-1 step in which the static magnetic field distribution is measured in a state where the electric current at the low current value is flowing in the superconducting coil when the electric current value of the superconducting coil reaches the low current value before the first step;
- a 1-2 step in which the distribution of the correction magnetic field that should be generated by the correction magnetic field generating unit is evaluated by the calculation control unit using the calculation based on the measurement result of the 1-1 step; and
- a 1-3 step in which the operator is notified to set the correction magnetic field of the correction magnetic field generating unit to the correction magnetic field evaluated in the 1-2 step in a state where the electric current at the low current value is flowing in the superconducting coil.

15. The magnetic field homogeneity adjusting method of the static magnetic field generating device according to claim 13, performing the following steps before repeating the first step again after the third step:
- a fourth step in which the static magnetic field inhomogeneity is measured in a state where the electric current at the low current value is flowing in the superconducting coil when the operator sets the correction magnetic field for the correction magnetic field generating unit after the notification;
- a fifth step in which the distribution of the correction magnetic field that should be generated by the correction magnetic field generating unit is evaluated by the calculation control unit using the calculation based on the measurement result of the fourth step; and
- a sixth step in which the operator is notified to set the correction magnetic field of the correction magnetic field generating unit to the correction magnetic field evaluated in the fifth step in a state where the electric current at the low current value is flowing in the superconducting coil.

* * * * *